United States Patent
Nam

(10) Patent No.: US 9,620,232 B2
(45) Date of Patent: Apr. 11, 2017

(54) NONVOLATILE MEMORY DEVICE AND METHOD OF OPERATING THE SAME

(71) Applicant: Sang-Wan Nam, Hwaseong-si (KR)

(72) Inventor: Sang-Wan Nam, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/130,237

(22) Filed: Apr. 15, 2016

(65) Prior Publication Data

US 2016/0232981 A1 Aug. 11, 2016

Related U.S. Application Data

(63) Continuation of application No. 14/681,748, filed on Apr. 8, 2015, now Pat. No. 9,318,202, which is a
(Continued)

(30) Foreign Application Priority Data

Feb. 4, 2014 (KR) ........................ 10-2014-0012738

(51) Int. Cl.
*G11C 16/10* (2006.01)
*G11C 16/26* (2006.01)
(Continued)

(52) U.S. Cl.
CPC .......... *G11C 16/26* (2013.01); *G11C 16/0483* (2013.01); *G11C 16/08* (2013.01);
(Continued)

(58) Field of Classification Search
CPC ................................................ G11C 16/3427
(Continued)

(56) References Cited

U.S. PATENT DOCUMENTS 7,408,811 B2 * 8/2008 Shirota .............. G11C 16/0483
365/185.17
7,423,908 B2 9/2008 Kim et al.
(Continued)

FOREIGN PATENT DOCUMENTS

| JP | 2007-080424 A | 3/2007 |
| KR | 2013-0080205 A | 7/2013 |
| KR | 2014-0107983 A | 9/2014 |

OTHER PUBLICATIONS

U.S. Office Action for corresponding U.S. Appl. No. 14/681,748 issued Sep. 11, 2015.

*Primary Examiner* — Son Mai
(74) *Attorney, Agent, or Firm* — Harness, Dickey & Pierce, P.L.C.

(57) ABSTRACT

According to example embodiments, an operation method of a nonvolatile memory device includes determining a location of a selected word line among word lines connected to the nonvolatile memory device, selecting one of a plurality of different read disturbance reducing modes according to the location of the selected word line, and performing a read or verification operation according to the selected read disturbance reducing modes. The nonvolatile memory device includes cell strings. Each one of the cell strings includes memory cells stacked on top of each other in a direction perpendicular to the substrate and between a ground select transistor and a string select transistor. The ground select transistor is between the substrate and the number of the memory cells. The string select transistor is connected to a bit line and is between the bit line and the number of the memory cells.

20 Claims, 21 Drawing Sheets

< Selected WL Prepulse (SWPP) >

Related U.S. Application Data continuation of application No. 14/608,760, filed on Jan. 29, 2015, now Pat. No. 9,312,008.

(51) Int. Cl.
  *G11C 16/04* (2006.01)
  *G11C 16/08* (2006.01)
  *G11C 16/34* (2006.01)
  *H01L 27/11582* (2017.01)

(52) U.S. Cl.
  CPC .......... *G11C 16/34* (2013.01); *G11C 16/3418* (2013.01); *G11C 16/3427* (2013.01); *G11C 16/3459* (2013.01); *H01L 27/11582* (2013.01)

(58) Field of Classification Search
  USPC .................................................. 365/185.18
  See application file for complete search history.

(56) References Cited

U.S. PATENT DOCUMENTS

| | | | |
|---|---|---|---|
| 7,468,919 B2 | 12/2008 | Sekar et al. | |
| 7,554,853 B2 | 6/2009 | Sekar et al. | |
| 7,679,133 B2 | 3/2010 | Son et al. | |
| 7,778,084 B2 | 8/2010 | Kim et al. | |
| 7,852,676 B2 | 12/2010 | Maejima | |
| 7,983,084 B2 | 7/2011 | Tokiwa et al. | |
| 8,018,777 B2 | 9/2011 | Kang | |
| 8,023,327 B2* | 9/2011 | Futatsuyama | G11C 11/5642 365/185.17 |
| 8,164,957 B2 | 4/2012 | Sekar et al. | |
| 8,391,075 B2 | 3/2013 | Fujiki et al. | |
| 8,427,878 B2 | 4/2013 | Shim et al. | |
| 8,441,853 B2 | 5/2013 | Li | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2005/0157564 A1* | 7/2005 | Hosono | G11C 11/5642 365/189.15 |
| 2006/0109716 A1 | 5/2006 | Kim et al. | |
| 2008/0158976 A1 | 7/2008 | Sekar et al. | |
| 2008/0159007 A1 | 7/2008 | Sekar et al. | |
| 2008/0205160 A1 | 8/2008 | Kim et al. | |
| 2009/0016110 A1 | 1/2009 | Choi et al. | |
| 2009/0168511 A1 | 7/2009 | Kang | |
| 2009/0268524 A1 | 10/2009 | Maejima | |
| 2010/0097858 A1 | 4/2010 | Tokiwa et al. | |
| 2011/0199833 A1 | 8/2011 | Shim et al. | |
| 2011/0233648 A1 | 9/2011 | Seol et al. | |
| 2012/0069679 A1 | 3/2012 | Fujiki et al. | |
| 2012/0081964 A1 | 4/2012 | Li | |
| 2012/0224426 A1 | 9/2012 | Nam et al. | |
| 2013/0170297 A1 | 7/2013 | Nam et al. | |
| 2015/0003169 A1 | 1/2015 | Nam et al. | |
| 2015/0063037 A1 | 3/2015 | Lee et al. | |

* cited by examiner

< Normal Read >

< GSL Split Power Reduction (GSPR) >

| Selected WL | Read | | | Verify | | |
|---|---|---|---|---|---|---|
| | SWPP | USPP | GSPR | SWPP | USPP | GSPR |
| Upper WL | X | X | X | X | X | X |
| Middle WL | X | X | O | X | X | X |
| Lower WL | O | O | X | O | O | X |

FIG. 16

| Selected WL | Operating Mode |
|---|---|
| WLn | GSPR (X) |
|  | SWPP (X) |
| WLn-1 | USPP (X) |
| WLn-2 |  |
| ⋮ | GSPR (O) |
|  | SWPP (X) |
|  | USPP (X) |
| WL3 |  |
| WL2 | GSPR (X) |
|  | SWPP (O) |
| WL1 | USPP (O) |

FIG. 17

| Sub Block | Selected WL | Operating Mode |
|---|---|---|
| Sub BLKm | WLn | GSPR (X) |
| | WLn-1 | SWPP (X) |
| | WLn-2 | USPP (X) |
| Sub BLKm-1 | WLn-3 | GSPR (O) |
| | WLn-4 | SWPP (X) |
| | WLn-5 | USPP (X) |
| ⋮ | ⋮ | ⋮ |
| Sub BLK2 | WL6 | GSPR (O) |
| | WL5 | SWPP (X) |
| | WL4 | USPP (X) |
| Sub BLK1 | WL3 | GSPR (X) |
| | WL2 | SWPP (O) |
| | WL1 | USPP (O) |

NONVOLATILE MEMORY DEVICE AND METHOD OF OPERATING THE SAME

CROSS-REFERENCE TO RELATED APPLICATIONS

This application is a continuation of U.S. application Ser. No. 14/681,748, filed on Apr. 8, 2015, which is a continuation application of U.S. patent application Ser. No. 14/608,760 filed on Jan. 29, 2015 and claims priority under 35 U.S.C. §119 to Korean Patent Application No. 10-2014-0012738, filed on Feb. 4, 2014, the entire contents of each of the above-referenced applications are hereby incorporated by reference.

FIELD

The present disclosure relates to semiconductor memory devices, and more particularly, to a nonvolatile memory device and a method of operating the same.

BACKGROUND

A semiconductor memory device may include at least one semiconductor such as silicon (Si), germanium (Ge), gallium arsenide (GaAs), indium phosphide (InP), etc. A semiconductor memory device may be classified as a volatile memory device or a nonvolatile memory device.

A volatile memory device loses its stored data when its power supply is interrupted. Examples of volatile memory devices include static RAM (SRAM), dynamic RAM (DRAM), synchronous DRAM (SDRAM), etc. A nonvolatile memory device may retain its stored data even when its power supply is interrupted. Examples of nonvolatile memory devices include read only memory (ROM), programmable ROM (PROM), electrically programmable ROM (EPROM), electrically erasable and programmable ROM (EEPROM), flash memory, phase change RAM (PRAM), magnetic RAM (MRAM), resistive RAM (RRAM), ferroelectric RAM (FRAM), etc. Flash memory may be classified as NOR type flash memory and NAND type flash memory.

A semiconductor memory device having a three-dimensional structure has been being studied to improve the integration of a semiconductor memory device. The three-dimensional semiconductor memory device has a different structure the two-dimensional semiconductor memory device. Because of a structural difference between the three-dimensional semiconductor memory device and the two-dimensional semiconductor memory device, various drive methods for driving the three-dimensional semiconductor memory device are being studied.

SUMMARY

According to example embodiments, an operation method of a nonvolatile memory device includes determining a location of selected word line, selecting one of a plurality of different read disturbance reducing modes according to the location of the selected word line, and performing a read or verification operation according to the selected one of the plurality of different read disturbance reducing modes. The selected word line is one of a plurality of word lines connected to a plurality of memory cells in the nonvolatile memory device. The plurality of memory cells are stacked on a substrate in the nonvolatile memory device. The nonvolatile memory device includes a plurality of cell strings. Each one of the cell strings includes a number of the memory cells stacked on top of each other in a direction perpendicular to the substrate and between a ground select transistor and a string select transistor. The ground select transistor is between the substrate and the number of the memory cells. The string select transistor is connected to a bit line and is between the bit line and the number of the memory cells.

In example embodiments, the nonvolatile memory device may include ground select lines connected to the ground select transistors in the cell strings and string select lines connected to the string select transistors in the cell strings. The determining the location of the selected word line may include determining if the selected word line is included in one of lower word lines, middle word lines, and upper word lines. The lower word lines may be a lower part of the plurality of word lines that are adjacent to the ground select lines. The upper word lines may be an upper part of the plurality of word lines that are adjacent to the string select lines. The middle word lines may be a middle part of the plurality of word lines that are between the lower word lines and the upper word lines.

In example embodiments, the selecting one of the plurality of different read disturbance reducing modes may include selecting a selected word line prepulse (SWPP) mode if the selected word line is one of the lower word lines. The SWPP mode may include applying a voltage to the selected word line that is equal to a voltage applied to unselected word lines among the plurality of word lines, applying a ground voltage to the selected word line after the applying the voltage to the selected word line that is equal to the voltage applied to the unselected word lines, and applying a select read voltage to the selected word line after the applying the ground voltage to the selected word line.

In example embodiments, the selecting one of the plurality of different read disturbance reducing modes may include selecting an unselected string select line prepulse (USPP) mode if the selected word line is one of the lower word lines. The USPP mode may include applying a voltage to unselected string select lines among the string select lines that is equal to a voltage applied to the selected string select line among the string select lines.

In example embodiments, the selecting one of the plurality of different read disturbance reducing modes may include selecting a ground select line split power reduction (GSPR) mode if the selected word line is one of the middle word lines. The GSPR mode may include applying a voltage to selected ground select line that has a different waveform than a waveform of a voltage applied to unselected ground select lines among the ground select lines. The GSPR mode may include applying a ground voltage to the selected ground select line after applying a same voltage to a selected string select line among the string select lines and the selected ground select line and applying a voltage to unselected string select lines among the string select lines that is the same as a voltage applied to the unselected ground select lines.

In example embodiment, a read speed of memory cells connected to the lower word lines may be lower than a read speed of memory cells connected to the middle word lines, and the read speed of memory cells connected to the middle word lines may be lower than a read speed of memory cells connected to the upper word lines.

According to example embodiments, a nonvolatile memory device includes a memory cell array, an address decoder, a read & write circuit, and a control logic. The memory cell array includes a plurality of memory cells stacked on a substrate, and a plurality of cell strings. Each of the plurality of cell strings includes a number of the memory cells stacked on top each other in a direction perpendicular to the substrate, and between a ground select transistor and a string select transistor. The string select transistor is connected to a corresponding bit line among a plurality of bit lines and is between the corresponding bit line and the number of the memory cells. The address decoder is connected to the memory cells through word lines. The address decoder is connected to the string select transistors of the cell strings through string select lines and connected to the ground select transistors of the cell strings through ground select lines. The read & write circuit is connected to the string select transistors of the cell strings through the plurality of bit lines. The control logic is configured to determine a location of a selected word line among the word lines. The control logic is configured to select one of a plurality of different read disturbance reducing modes according to the location of the selected word line. The control logic is configured to perform a read or verification operation according to the selected one of the plurality of different read disturbance reducing modes.

In example embodiments, the control logic may be configured to select a selected word line prepulse mode (SWPP) if the selected word line is included in the first sub block. The control logic may be configured to control the address decoder according to the SWPP mode. The SWPP mode may include applying a voltage to the selected word line that is equal to a voltage applied to unselected word lines among the word lines, applying a ground voltage to the selected word line after the applying the voltage to the selected word line that is equal to the voltage applied to the unselected word lines, and applying a select read voltage to the selected word line after the applying the ground voltage to the selected word line.

In example embodiments, the control logic may be configured to select an unselected string select line prepulse (USPP) mode if the selected word line is included in the first sub block. The control logic may be configured to control the address decoder according to the USPP mode. The USPP mode may include applying a voltage to unselected string select lines among the string select lines that is equal to a voltage applied to the selected string select line among the string select lines.

In example embodiments, the control logic may be configured to select a ground select line split power reduction (GSPR) mode if the selected word line is included in the first sub block. The control logic may be configured to control the address decoder according to the GSPR mode. The GSPR mode may include applying a ground voltage to the selected ground select line after applying a same voltage to a selected string select line among the string select lines and the selected ground select line and applying a voltage to unselected string select lines among the string select lines that is the same as a voltage applied to the unselected ground select lines.

According to example embodiments, an operation mode of a nonvolatile memory device includes determining a position of a selected word line among a plurality of word lines connected to a plurality of cell strings in a nonvolatile memory device, selecting one of a plurality of different operation modes according to the position of the selected word line, and performing a read or verification operation according to the selected one of the plurality of different operation modes. Each one of the cell strings includes memory cells stacked on top of each other between a ground select transistor and a string select transistor. The nonvolatile memory device includes string selection lines and ground selection lines that are respectively connected to the string select transistors and the ground select transistors in a same row of the plurality of cell strings.

In example embodiments, the plurality of word lines may be connected to the memory cells at equal heights, respectively. The plurality of word lines may include lower word lines, middle word lines on the lower word lines, and upper word lines on the middle word lines. The selecting the one of the plurality of different operation modes may include (i) adjusting a voltage applied to one of the selected word line and unselected string selection lines among the string selection lines from a ground voltage to an unselected read voltage and then back to the ground voltage if the selected word line is one of the lower word lines, and (ii) applying a select read voltage to the selected word line after the adjusting the voltage applied to the one of the selected word line and the unselected string selection line. A magnitude of the select read voltage may be between a magnitude of the unselected read voltage and a magnitude of the ground voltage.

In example embodiments, the plurality of word lines may be connected to the memory cells at equal heights, respectively. The plurality of word lines may include lower word lines, middle word lines on the lower word lines, and upper word lines on the middle word lines. The selecting the one of the plurality of different operation modes may include (i) selecting a normal operation mode if the selected word line is one of the upper word lines, (ii) selecting the normal operation mode if the selected word line is one of the middle word lines and the performing the read or verification operation includes performing the verification operation, (iii) selecting a ground select line split power reduction (GSPR) mode if the selected word line is one of the middle word lines and the performing the read or verification includes performing the read operation, and (iv) selecting one of a selected word line prepulse (SWPP) mode and an unselected string select line prepulse (USPP) mode if the selected word line is one of the lower word lines. The normal operation mode, the GSPR mode, the SWPP mode, and the USPP mode may include adjusting a voltage applied to a selected string selection line among the string selection lines and unselected word lines among the plurality of word lines from a ground voltage to an unselected read voltage, and applying a select read voltage to the selected word line after applying the applying the ground voltage to the selected word line. The SWPP mode may include adjusting the voltage applied to the selected word line from the ground voltage to the unselected read voltage, back to the ground voltage, and then to the select read voltage. The USPP mode may include adjusting the voltage applied to unselected string selection lines among the string selection lines from the ground voltage to the unselect read voltage and then back to the ground voltage. The GSPR mode may include applying a voltage waveform to a selected ground selection line among the ground selection lines that is different than a voltage waveform applied to unselected ground selection lines among the ground selection lines. A magnitude of the select read voltage may be between a magnitude of the unselected read voltage and a magnitude of the ground voltage.

In example embodiments, the GSPR mode may include (i) applying the ground voltage to the unselected ground selection lines as the voltage waveform applied to the unselected ground selection lines, and adjusting the voltage applied to the selected ground selection line from the ground voltage to the unselected read voltage and then back to the ground voltage as the voltage waveform applied to the selected ground selection line.

In example embodiments, the plurality of word lines may be connected to the memory cells at equal heights, respectively. The plurality of word lines may include lower word lines, middle word lines on the lower word lines, and upper word lines on the middle word lines. The selecting the one of the plurality of different operation modes may include (i) adjusting a voltage applied to a selected ground selection line among the ground selection lines from a ground voltage to an unselected read voltage back to the ground voltage and then back to the unselected read voltage if the selected word line is one of the middle word lines, (ii) applying the ground voltage to unselected ground selection lines among the ground selection lines during the adjusting the voltage applied to the selected ground selection line, and (iii) adjusting a voltage applied to unselected word lines among the plurality of word lines from the ground voltage to the unselect read voltage. A magnitude of the select read voltage may be between a magnitude of the unselected read voltage and a magnitude of the ground voltage.

BRIEF DESCRIPTION OF THE FIGURES

The foregoing and other features of example embodiments of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 16 is a flow chart illustrating a method of operating a nonvolatile memory device in accordance with example embodiments.

FIG. 17 is a flow chart illustrating a method of operating a nonvolatile memory device in accordance with example embodiments.

DETAILED DESCRIPTION OF EXAMPLE EMBODIMENTS

Figure 1:
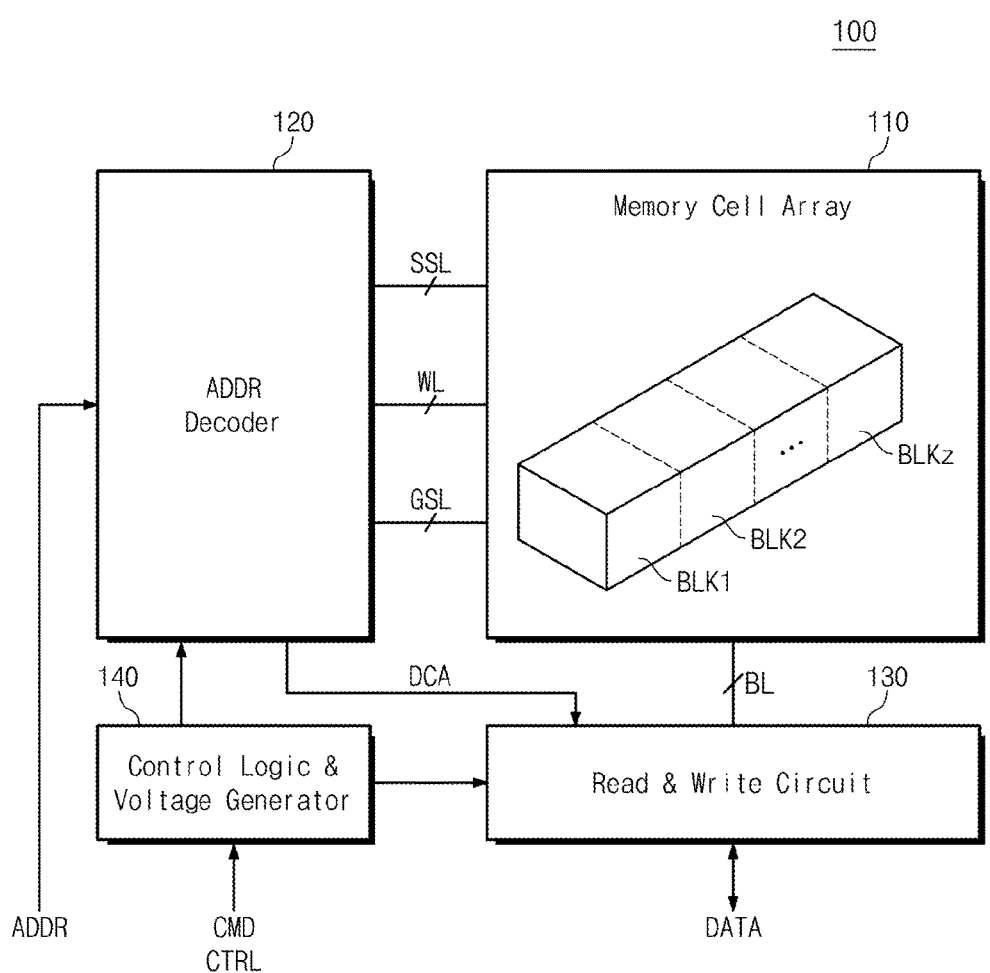
FIG. 1 is a block diagram illustrating a nonvolatile memory device in accordance with example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

A memory system including a nonvolatile memory device will be used as an example of a storage device or an electronic device for explaining a feature or function of example embodiments of inventive concepts. A feature of example embodiments of inventive concepts may be described by assuming that a data unit being moved is a sector unit but the data unit is not limited to the sector unit. Those skilled in the art will readily appreciate other advantages and functions of example embodiments of inventive concepts by the present disclosure. A NAND type flash memory is described as a storage medium but other nonvolatile memory devices may be described as a storage medium. For example, a PRAM, a MRAM, an ReRAM, a FRAM, a NOR flash memory, etc. may be used as a storage medium and they may be applied to a memory system in which different kinds of memory devices are mixed.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A 'selected memory block' indicates a memory block selected for a program, read or erase operation among a plurality of memory blocks. A 'selected sub block' indicates a sub block selected for a program, read or erase operation among a plurality of sub blocks.

A 'selected bit line' or 'selected bit lines' indicates a bit line or bit lines connected to a cell transistor that is becoming an object of a program or read operation among a plurality of bit lines. An 'unselected bit line' or 'unselected bit lines' indicates a bit line or bit lines connected to a cell transistor that is becoming an object of a program or read inhibit operation among a plurality of bit lines.

A 'selected string select line' indicates a string select line connected to a cell string including a cell transistor that is becoming an object of a program or read operation among a plurality of string select lines. An 'unselected string select line' or 'unselected string select lines' indicates the remaining string select line or the remaining string select lines except the selected string select line among a plurality of string select lines. The 'selected string select transistors' indicate string select transistors connected to a selected string select line. The 'unselected string select transistors' indicate string select transistors connected to an unselected string select line or unselected string select lines.

A 'selected ground select line' indicates a ground select line connected to a cell string including a cell transistor that is becoming an object of a program or read operation among a plurality of ground select lines. An 'unselected ground select line' or 'unselected ground select lines' indicates the remaining ground select line or the remaining ground select lines except the selected ground select line among a plurality of ground select lines. The 'selected ground select transistors' indicate ground select transistors connected to a selected ground select line. The 'unselected ground select transistors' indicate ground select transistors connected to an unselected ground select line or unselected ground select lines.

A 'selected word line' indicates a word line connected to a cell transistor that is becoming an object of a program or read operation among a plurality of word lines. An 'unselected word line' or 'unselected word lines' indicates the remaining word line or the remaining word lines except the selected word line among a plurality of word lines.

A 'selected memory cell' or 'selected memory cells' indicates memory cells that are becoming an object of a program or read operation among a plurality of memory cells. An 'unselected memory cell' or 'unselected memory cells' indicates the remaining memory cell or the remaining memory cells except the selected memory cell or selected memory cells among a plurality of memory cells.

Example embodiments of inventive concepts may be described with reference to a NAND type flash memory. However, example embodiments of inventive concepts are not limited to a NAND type flash memory and may be applied to various types of nonvolatile memory devices such as an electrically erasable and programmable ROM (EEPROM), a NOR flash memory device, a phase-change RAM (PRAM), a magnetic RAM (MRAM), a resistive RAM (RRAM), a ferroelectric RAM (FRAM), etc.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a nonvolatile memory device in accordance with example embodiments.

Referring to FIG. 1, a nonvolatile memory device 100 includes a memory cell array 110, an address decoder 120, a read & write circuit 130 and a control logic & voltage generator 140.

The memory cell array 110 is connected to the address decoder 120 through string select lines SSLs, word lines WLs and ground select lines GSLs and connected to the read & write circuit 130 through bit line BLs. The memory cell array 110 includes a plurality of memory blocks BLK1~BLKz. Each memory block may include a plurality of memory cells and a plurality of select transistors. Memory cells are connected to word lines WLs and select transistors may be connected to string select lines SSLs or ground select lines GSLs. Memory cells of each memory block are stacked in a direction perpendicular to a substrate to form a three-dimensional structure. Memory cells of each memory block can store one or more bits.

The address decoder 120 is connected to the memory cell array 110 through string select lines SSL, word lines WL and ground select lines GSL. The address decoder 120 is configured to operate under the control of the control logic & voltage generator 140. The address decoder 120 receives an address ADDR from an external device.

The address decoder 120 is configured to decode a row address among the received addresses ADDR. Using the decoded row address, the address decoder 120 selects string select lines SSL, word lines WL and ground select lines GSL. The address decoder 120 receives various voltages from the control logic & voltage generator 140 and can transmit the received voltages to the string select lines SSL, the word lines WL and the ground select lines GSL respectively.

The address decoder 120 is configured to decode a column address among the transmitted addresses ADDR. The decoded column address DCA is transmitted to the read & write circuit 130. The address decoder 120 includes constituent elements such as a row decoder, a column decoder, an address buffer, etc.

The read & write circuit 130 is connected to the memory cell array 110 through bit lines BL and exchanges data with the outside. The read & write circuit 130 operates in response to a control of the control logic & voltage generator 140. The read & write circuit 130 is configured to receive the decoded column address DCA decoded from the address decoder 120. Using the decoded column address DCA, the read & write circuit 130 selects bit lines BL.

The read & write circuit 130 receives data from the outside and writes the received data in the memory cell array 110. The read & write circuit 130 reads data from the memory cell array 110 and transmits the read data to the outside. The read & write circuit 130 reads data from a first storage region of the memory cell array 110 and writes the read data in a second storage region of the memory cell array 110. The read & write circuit 130 is configured to perform a copy-back operation.

The read & write circuit 130 includes constituent elements such as a page buffer (or a page register), a column select circuit, a data buffer, etc. The read & write circuit 130 includes constituent elements such as a sense amplifier, a write driver, a column circuit, a data buffer, etc.

The control logic & voltage generator 140 is connected to the address decoder 120 and the read & write circuit 130. The control logic & voltage generator 140 is configured to control overall operations of the nonvolatile memory device 100. The control logic & voltage generator 140 is configured to generate various voltages being required in the nonvolatile memory device 100. The control logic & voltage generator 140 operates in response to a control signal CTRL and a command CMD being from the outside.

Figure 2:
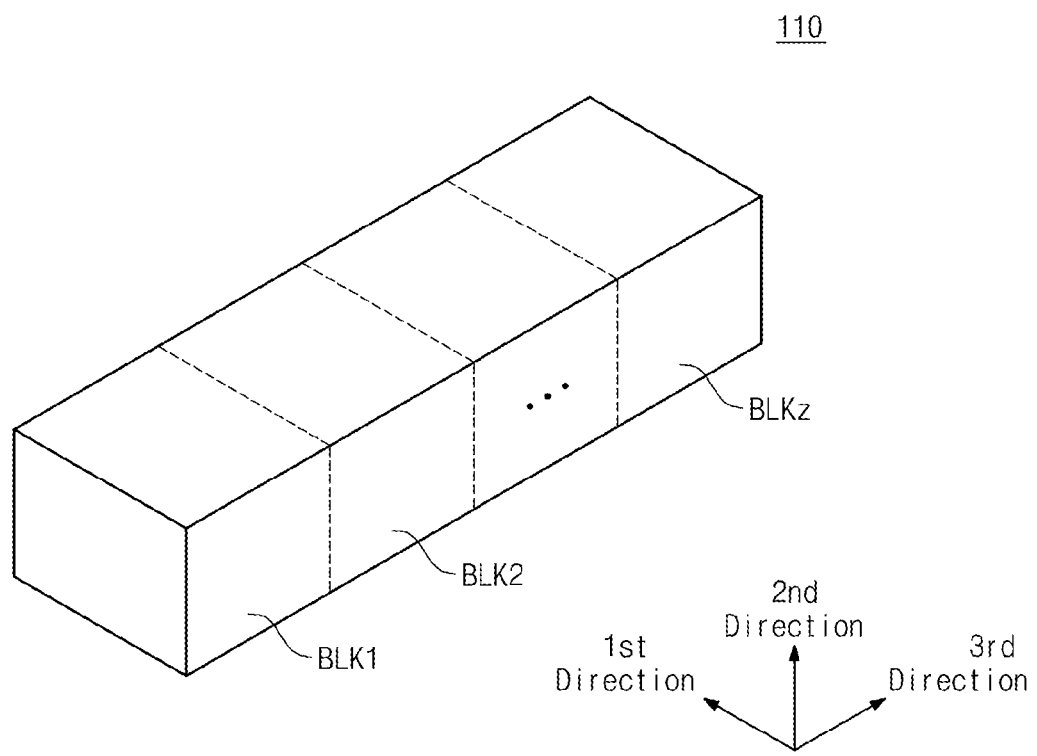
FIG. 2 is a block diagram illustrating a memory cell array of FIG. 1.

FIG. 2 is a block diagram illustrating a memory cell array of FIG. 1.

Referring to FIG. 2, the memory cell array 110 includes a plurality of memory blocks BLK1~BLKz. Each memory block BLK has a three-dimensional structure (or a vertical structure). For example, each memory block BLK includes structures extending along first through third directions. Each memory block BLK includes a plurality of NAND strings NS extending along the second direction. For example, a plurality of NAND strings NS is provided along the first through third directions.

Each NAND string NS is connected to a bit line BL, a string select line SSL, a ground select line GSL, word lines WL and a common source line CSL. That is, each memory block is connected to a plurality of bit lines BL, a plurality of string select lines SSL, a plurality of ground select lines GSL, a plurality of word lines WL and a plurality of common source lines CSL.

Figure 3:
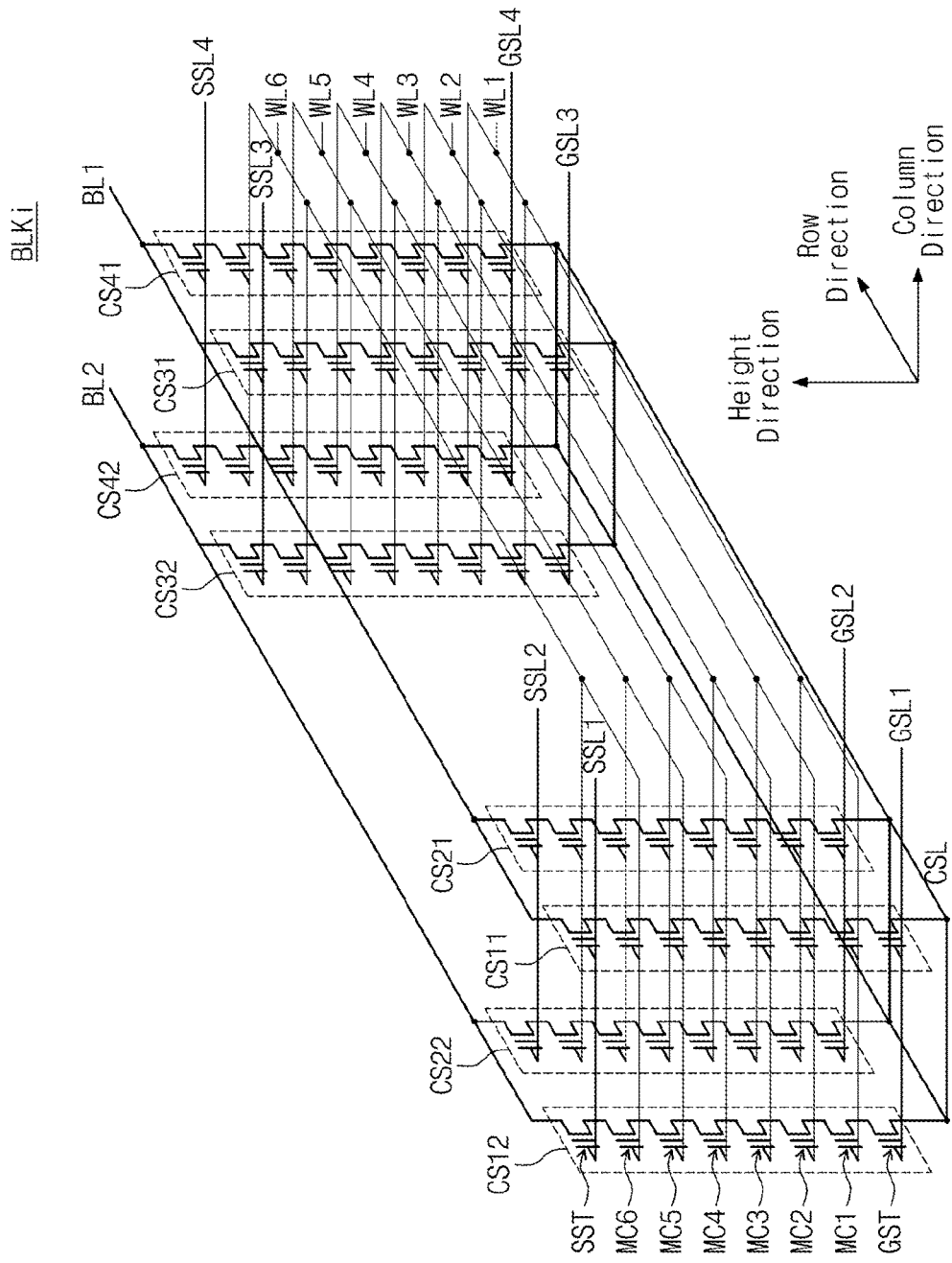
FIG. 3 is a circuit diagram illustrating a memory block BLKi in accordance with example embodiments.

FIG. 3 is a circuit diagram illustrating a memory block BLKi in accordance with example embodiments. As an illustration, one of the memory blocks BLK1~BLKz of the memory cell array 110 of FIG. 2 is illustrated in FIG. 3.

Referring to FIGS. 2 and 3, the memory block BLKi includes a plurality of cell strings CS11~CS41 and CS12~CS42. The cell strings CS11~CS41 and CS12~CS42 are arranged along a row direction and a column direction to form rows and columns.

Each cell string includes a ground select transistor GST, memory cells MC1~MC6 and a string select transistor SST. The ground select transistor GST, the memory cells MC1~MC6 and the string select transistor SST of each cell string may be vertically stacked on a substrate.

Rows of the cell strings CS11~CS41 and CS12~CS42 are connected to different string select lines SSL1~SSL4 respectively. String select transistors SST of the cell strings CS11 and CS12 are connected to the string select line SSL1 in common. String select transistors SST of the cell strings CS21 and CS22 are connected to the string select line SSL2 in common. String select transistors SST of the cell strings CS31 and CS32 are connected to the string select line SSL3 in common. String select transistors SST of the cell strings CS41 and CS42 are connected to the string select line SSL4 in common.

Columns of the cell strings CS11~CS41 and CS12~CS42 are connected to different bit lines BL1 and BL2. For example, string select transistors SST of the cell strings CS11~CS41 are connected to the bit line 1 in common. String select transistors SST of the cell strings CS12~CS42 are connected to the bit line 2 in common.

Rows of the cell strings CS11~CS41 and CS12~CS42 are connected to different ground select lines GSL1~GSL4 respectively. Ground select transistors GST of the cell strings CS11 and CS12 are connected to the ground select line GSL1 in common. Ground select transistors GST of the cell strings CS21 and CS22 are connected to the ground select line GSL2 in common. Ground select transistors GST of the cell strings CS31 and CS32 are connected to the ground select line GSL3 in common. Ground select transistors GST of the cell strings CS41 and CS42 are connected to the ground select line GSL4 in common.

Memory cells located at the same height from the substrate (or ground select transistors GST) are connected to one word line in common. Memory cells located at the different heights from the substrate (or ground select transistors GST) are connected to different word lines WL1~WL6 respectively. For example, memory cells MC1 are connected to the word line WL1 in common. Memory cells MC2 are connected to the word line WL2 in common. Memory cells MC3 are connected to the word line WL3 in common. Memory cells MC4 are connected to the word line WL4 in common. Memory cells MC5 are connected to the word line WL5 in common. Memory cells MC6 are connected to the word line WL6 in common.

Ground select transistors GST of the cell strings CS11~CS41 and CS12~CS42 are connected to a common source line CSL in common.

The memory block BLKi illustrated in FIG. 3 is an illustration. The spirit of the inventive concept is not limited to the memory block BLKi illustrated in FIG. 3. For example, the number of rows of cell strings may increase or decrease. As the number of rows of the cell strings is changed, the number of string select lines connected to the rows of the cell strings and the number of cell strings connected to one bit line may also be changed. As the number of rows of the cell strings is changed, the number of ground select lines connected to the rows of the cell strings may also be changed.

The number of columns of cell strings may increase or decrease. As the number of columns of the cell strings is changed, the number of bit lines connected to the columns of the cell strings and the number of cell strings connected to one string select line may also be changed.

A height of the cell strings may increase or decrease. For example, the number of memory cells being stacked in each cell string may increase or decrease. As the number of memory cells being stacked in each cell string may be changed, the number of word lines may also be changed. For example, the number of the string select transistors or the ground select transistors being provided each cell string may increase. As the number of the string select transistors or the ground select transistors being provided each cell string is changed, the number of the string select lines or the ground select lines may also be changed. If the number of the string select lines or the ground select lines increases, the string select transistors or the ground select transistors may be stacked in the same form as the memory cells MC1~MC6.

Write and read operations can be performed by a row unit of the cell strings CS11~CS41 and CS12~CS42. The cell strings CS11~CS41 and CS12~CS42 can be selected by one row unit by the ground select lines GSL1~GSL4. The cell strings CS11~CS41 and CS12~CS42 can be selected by one row unit by the string select lines SSL~SSL4. The ground select lines GSL1~GSL4 are divided into at least two groups GSL1~GSL2 and GSL3~GSL4 and a voltage may be applied to the two groups by one unit. A voltage may be applied to one group GSL1~GSL4 by one unit.

In a selected row of the cell strings CS11~CS41 and CS12~CS42, write and read operations can be performed by a page unit. The page may be one row of memory cells connected to one word line. In a selected row of the cell strings CS11~CS41 and CS12~CS42, memory cells may be selected by a page unit by the word lines WL1~WL6.

Figure 4:
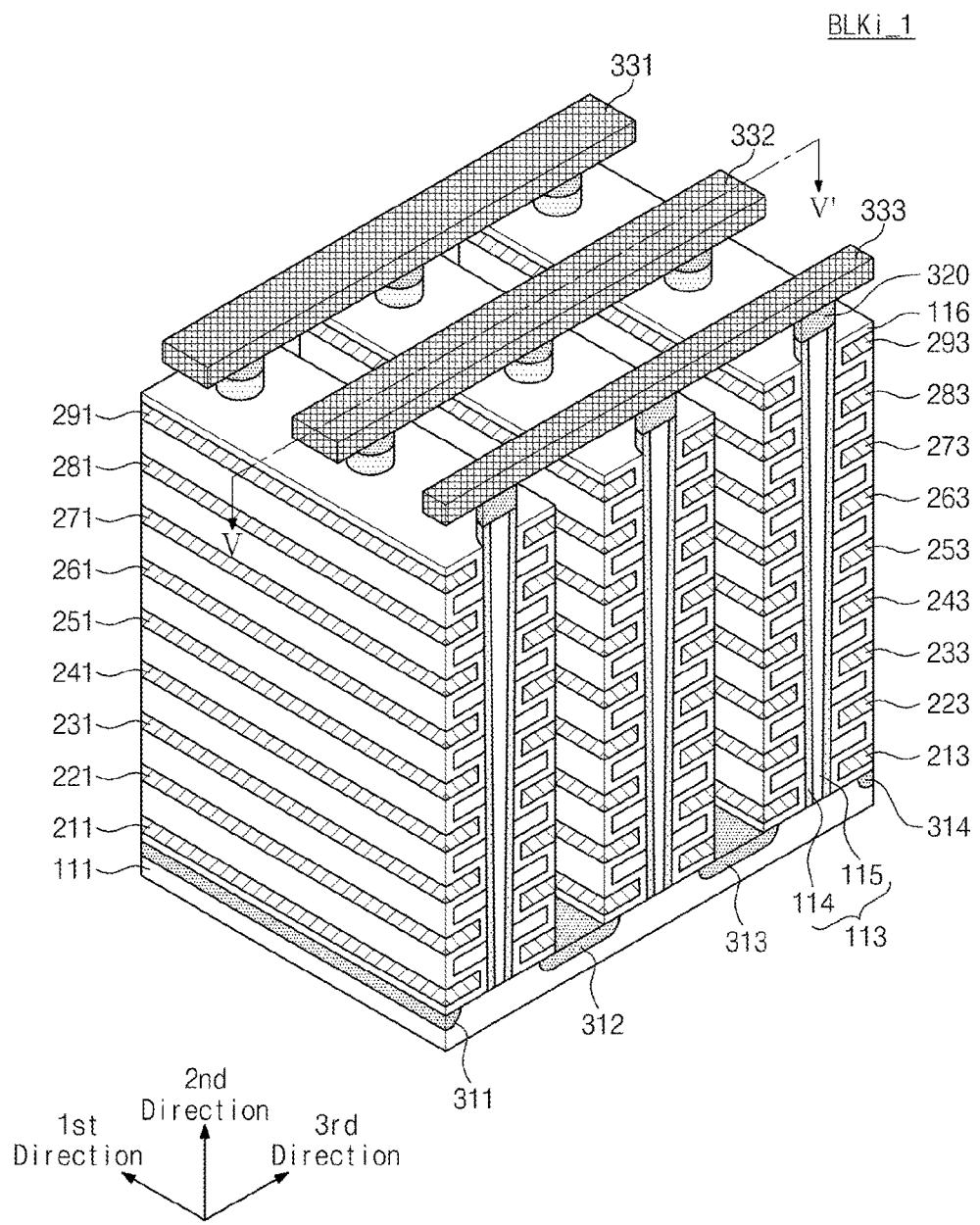
FIG. 4 is a perspective view illustrating a memory block BLKi_1 of a structure corresponding to the memory block BLKi of FIG. 3 according to example embodiments.
Figure 5:
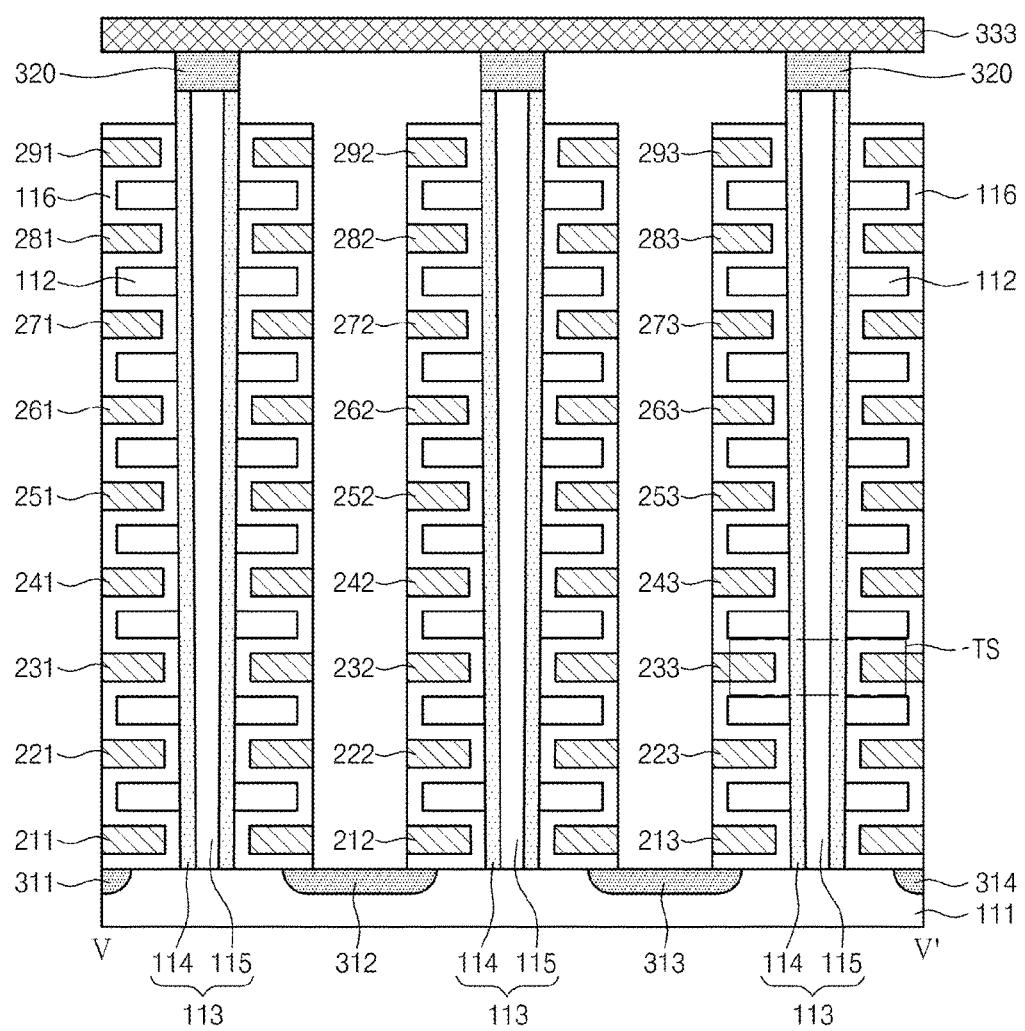
FIG. 5 is a cross sectional view taken along the line V-V' of the memory block BLKi_1 of FIG. 4.

FIG. 4 is a perspective view illustrating a memory block BLKi_1 of a structure corresponding to the memory block BLKi of FIG. 3 according to example embodiments. FIG. 5 is a cross sectional view taken along the line V-V' of the memory block BLKi_1 of FIG. 4. Referring to FIGS. 4 and 5, the memory block BLKi_1 includes structures extending in first through third directions.

A substrate 111 is provided. The substrate 111 includes silicon material doped with a first type impurity. For example, the substrate 111 may include silicon material doped with a p type impurity. The substrate 111 may be a p type well (for example, a pocket p well). It is assumed that the substrate 111 is p type silicon. However, the substrate 111 is not limited to p type silicon.

On the substrate 111, a plurality of doping regions 311~314 is provided. For example, the doping regions 311~314 may have a second type different from the substrate 111. The doping regions 311~314 may have an n type. It is assumed that the first through fourth doping regions 311~314 are an n type. However, the first through fourth doping regions 311~314 are not limited to an n type.

A plurality of insulating materials 112 extending in the first direction is sequentially provided along the second direction on a region of the substrate 111 between the first and second doping regions 311 and 312. The insulating materials 112 and the substrate 111 are provided to be spaced a desired (and/or alternatively predetermined) distance apart from one another along the second direction. For example, the insulating materials 112 are provided to be spaced a desired (and/or alternatively predetermined) distance apart from one another along the second direction. The insulating materials 112 may include silicon oxide.

A plurality of pillars 113 which is sequentially disposed along the first direction and penetrates the insulating materials 112 along the second direction is provided on a region of the substrate 111 between the first and second doping regions 311 and 312. Each of the pillars 113 penetrates the insulating materials 112 to be connected to the substrate 111.

Each pillar 113 is constituted by a plurality of materials. A surface layer 114 of each pillar may include silicon material doped with the first type. For example, a surface layer 114 of each pillar may include silicon material doped with the same type as the substrate 111. It is assumed that a surface layer 114 of each pillar includes p-type silicon. However, a surface layer 114 of each pillar is not limited to include p-type silicon.

An internal layer 115 of each pillar 113 is constituted by insulating material. For example, an internal layer 115 of each pillar 113 may include silicon oxide.

An insulating layer 116 is provided along an exposed surface of the insulating materials 112, the pillars 113 and the substrate 111 on a region between the first and second doping regions 311 and 312. A thickness of the insulating layer 115 may be smaller than half of a distance between the insulating materials 112. That is, among the insulating materials 112, between the insulating layer 116 provided on a bottom surface of the first insulating material and the insulating layer 116 provided on a top surface of the second insulating material below the first insulating material, a region may be provided in which material besides the insulating materials 112 and the insulating layer 116 may be disposed.

On a region between the first and second doping regions 311 and 312, conductive materials 211~291 are provided on an exposed surface of the insulating layer 116. For example, the conductive material 211 extending along the first direction is provided between the insulating material 112 adjacent to the substrate 111 and the substrate 111. That is, the conductive material 211 extending along the first direction is provided between the insulating layer 116 of a bottom surface of the insulating material 112 adjacent to the substrate 111 and the substrate 111.

Among the insulating materials 112, between the insulating layer 116 of a top surface of specific insulating material and the insulating layer 116 of a bottom surface of the insulating material disposed over the specific insulating material, conductive material extending in the first direction is provided. For example, a plurality of conductive materials 221~281 extending in the first direction is provided between the insulating materials 112. A conductive material 291 extending in the first direction is provided on the uppermost insulating material 112. The conductive materials 211~291 may be metal material. The conductive materials 211~291 may be conductive material such as poly silicon.

On a region between the second and third doping regions 312 and 313, a structure which is the same as the structure on a region between the first and second doping regions 311 and 312. On a region between the second and third doping regions 312 and 313, a plurality of insulating materials 112 extending in the first direction, a plurality of pillars 113 which is sequentially disposed along the first direction and penetrates the insulating materials 112 along the third direction, an insulating layer 116 being provided on an exposed surface of the insulating materials 112 and the pillars 113, and a plurality of conductive materials 212~292 extending in the first direction are provided.

On a region between the third and fourth doping regions 313 and 314, a structure which is the same as the structure on a region between the first and second doping regions 311 and 312. On a region between the third and fourth doping regions 313 and 314, a plurality of insulating materials 112 extending in the first direction, a plurality of pillars 113 which is sequentially disposed along the first direction and penetrates the insulating materials 112 along the third direction, an insulating layer 116 being provided on an exposed surface of the insulating materials 112 and the pillars 113, and a plurality of conductive materials 213~293 extending in the first direction are provided.

Drains 320 are provided on the pillars 113. The drains 320 may be silicon material doped with a second type. For example, the drains 320 may be silicon materials doped with an n-type. It is assumed that the drains 320 include n-type silicon. However, the drains 320 are not limited to include n-type silicon. A width of each drain 320 is greater than a width of the pillar 113. For example, each drain 320 may be provided on a top surface of the corresponding pillar 113 in a pad form.

On the drains 320, conductive materials 331~333 extending in the third direction are provided. The conductive materials 331~333 are sequentially disposed along the first direction. The conductive materials 331~333 are connected to the respective drains 320. The drains 320 and the conductive materials 331~333 can be connected to one another through contact plugs. The conductive materials 331~333 extending in the third direction are metal material. The conductive materials 331~333 extending in the third direction are conductive material such as poly silicon.

In FIGS. 4 and 5, each pillar 113 forms a NAND string NS together with the insulating layer 116 and the conductive lines 211~291, 212~292 and 213~293 extending in the first direction. The NAND string NS includes a plurality of transistor structures TS.

Figure 6:
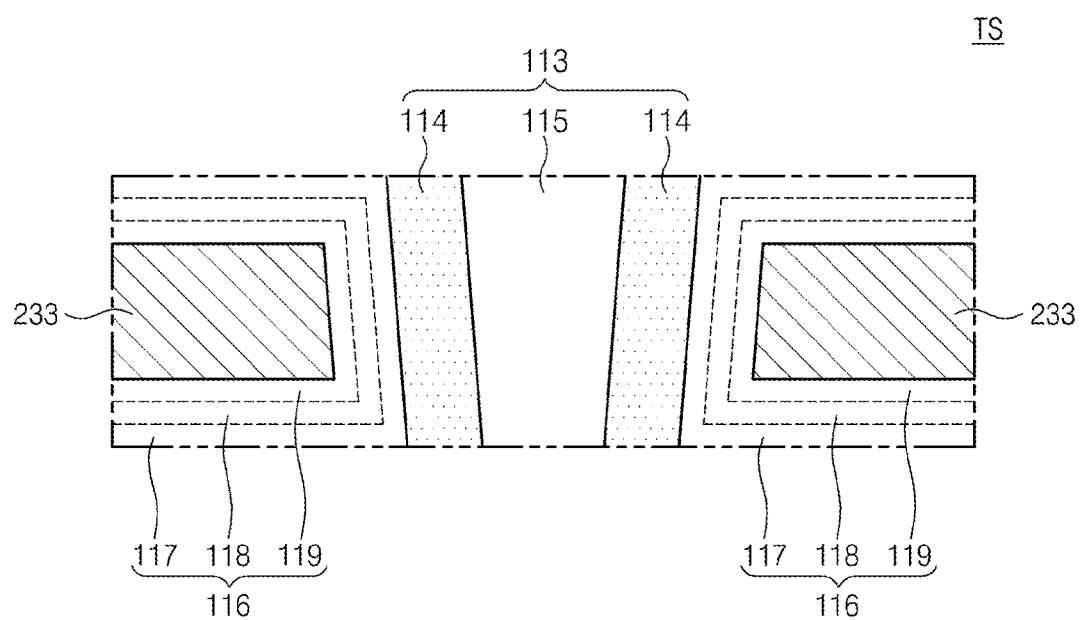
FIG. 6 is a cross sectional view illustrating a transistor structure TS of FIG. 5 according to example embodiments.

FIG. 6 is a cross sectional view illustrating a transistor structure TS of FIG. 5 according to example embodiments. Referring to FIGS. 4 through 6, the insulating layer 116 includes at least three sub insulating layers 117, 118 and 119.

The p-type silicon of the pillar 113 operates as a body. A first sub insulating layer 117 adjacent to the pillar 113 operates as a tunneling insulating layer. For example, the first sub insulating layer 117 adjacent to the pillar 113 may include a thermal oxide layer.

A second sub insulating layer 118 operates as a charge storage layer. For example, the second sub insulating layer 118 operates as a charge capture layer. The second sub insulating layer 118 includes a nitride layer or a metal oxide layer (e.g., aluminum oxide layer, hafnium oxide layer, etc.).

A third sub insulating layer 119 adjacent to the conductive material 233 operates as a blocking insulating layer. The third sub insulating layer 119 adjacent to the conductive material 233 extending in the first direction may be formed in a single layer or a multilayer. The third sub insulating layer 119 may be a high dielectric layer (e.g., aluminum oxide layer, hafnium oxide layer, etc.) having a dielectric constant higher than the first and second sub insulating layers 117 and 118.

The conductive material 233 operates as a gate (or a control gate). That is, the gate 233, the blocking insulating 119, the charge storage layer 118, the tunneling insulating layer 117 and the body 114 form a transistor (or a memory cell transistor structure). The first through third sub insulating layers 117~119 can constitute an oxide-nitride-oxide (ONO). The p-type silicon 114 of the pillar 113 is called a second directional body.

The memory block BLKi includes a plurality of pillars 113. That is, the memory block BLKi includes a plurality of NAND strings NS. That is, the memory block BLKi includes a plurality of NAND strings NS extending in the second direction (a direction perpendicular to the substrate 111).

Each NAND string NS includes a plurality of transistor structures TS being disposed along the second direction. At least one of the transistor structures TS of each NAND string NS operates as a string select transistor SST. At least one of the transistor structures TS of each NAND string NS operates as a ground select transistor SST.

The gates correspond to the conductive materials 211~291, 212~292 and 213~293 extending in the first direction. That is, the gates extend in the first direction to form word lines and at least two select lines (at least one string select line SSL and at least one ground select line GSL).

The conductive materials 331~333 extending in the third direction are connected to one end of the NAND strings NS. The conductive materials 331~333 extending in the third direction operate as bit lines BL. That is, in one memory block BLKi_1, a plurality of NAND strings is connected to one bit line BL.

The second type doping regions 311~314 extending in the first direction are provided to the other ends of the NAND strings NS. The second type doping regions 311~314 extending in the first direction operate as a common source line CSL.

The memory block BLKi_1 includes a plurality of NAND strings extending in the second direction (a direction perpendicular to the substrate 111) and operates as a NAND flash memory block (for example, a charge capture type) that a plurality of NAND strings is connected to one bit line BL.

In FIGS. 4 through 6, the conductive lines 211~291, 212~292 and 213~293 extending in the first direction are provided to nine layers. However, the conductive lines 211~291, 212~292 and 213~293 extending in the first direction are not limited to be provided to nine layers. For example, the conductive lines 211~291, 212~292 and 213~293 extending in the first direction may be provided to 8 layers, 16 layers or a plurality of layers. That is, in one NAND string, the number of the transistors may be 8, 16 or the plural number.

In FIGS. 4 through 6, three NAND strings NS are connected to one bit line BL. However, three NAND strings NS are not limited to be connected to one bit line BL. In the memory block BLKi_1, m number of NAND strings NS may be connected to one bit line BL. As the number of the NAND strings NS connected to one bit line BL is changed, the number of the conductive materials 211~291, 212~292 and 213~293 and the common source lines 311~314 extending in the first direction may be controlled.

In FIGS. 4 through 6, three NAND strings NS are connected to one conductive material extending in the first direction. However, three NAND strings NS are not limited to be connected to one conductive material extending in the first direction. For example, n number of NAND strings NS may be connected to one conductive material extending in the first direction. As the number of NAND strings NS connected to one conductive material extending in the first direction is changed, the number of bit lines 331~333 may be controlled.

As illustrated in FIGS. 4 through 6, a width of the pillar 113 is changed depending on a height of the memory cell MC. A width of the pillar 113 may be changed by a characteristic or error of the process. For example, as a height of the memory cell MC is reduced, that is, as a distance between the string select line SSL and the word line WL increases, a width of the pillar 113 is reduced.

The pillar 113 includes the silicon oxide layer 117 that operates as a tunneling insulating layer, the silicon nitride layer 118 that operates as a charge storage layer, and the silicon oxide layer 119 that operates as a blocking insulating layer. An electric field is formed between the gate and the body 114 due to a voltage difference between the gate and the body 114. The formed electric field is distributed to the tunneling insulating layer 117, the charge storage layer 118 and the blocking insulating layer 119.

The electric field distributed to the tunneling insulating layer 117 causes a Fowler-Nordheim tunneling. That is, the memory cell MC is programmed or erased by an electric field being distributed to the tunneling insulating layer 117. The amount of charges being captured by the charge storage layer 118 in a program operation or the amount of charges being flowed out of the charge storage layer 118 in an erase operation may be determined according to an electric field being distributed to the tunneling insulating layer 117.

The electric field is distributed to the tunnel insulating layer 117, the charge storage layer 118 and the blocking insulating layer 119 on the basis of capacitances of the tunnel insulating layer 117, the charge storage layer 118 and the blocking insulating layer 119. As a width of the pillar 113 is reduced, an area ratio of the tunneling insulating layer 117 to the blocking insulating layer 119 is reduced. As the area ratio of the tunneling insulating layer 117 to the blocking insulating layer 119 is reduced, a capacitance ratio of the tunneling insulating layer 117 to the blocking insulating layer 119 is reduced. As the capacitance ratio of the tunneling insulating layer 117 to the blocking insulating layer 119 is reduced, an electric field being distributed to the tunneling insulating layer 117 increases.

Thus, as a width of the pillar 113 is reduced, the amount of charges being captured by the charge storage layer 118 in a program operation or the amount of charges being flowed out of the charge storage layer 118 in an erase operation increases. By a width difference of the pillar 113, the magnitude of a tunneling effect is changed and in a program operation or an erase operation, an amount of threshold voltage variation is changed. To compensate a difference of a tunneling effect (or amount of threshold voltage variation) caused by a change of a width of the pillar 113, levels of word line voltages may be controlled.

Figure 7:
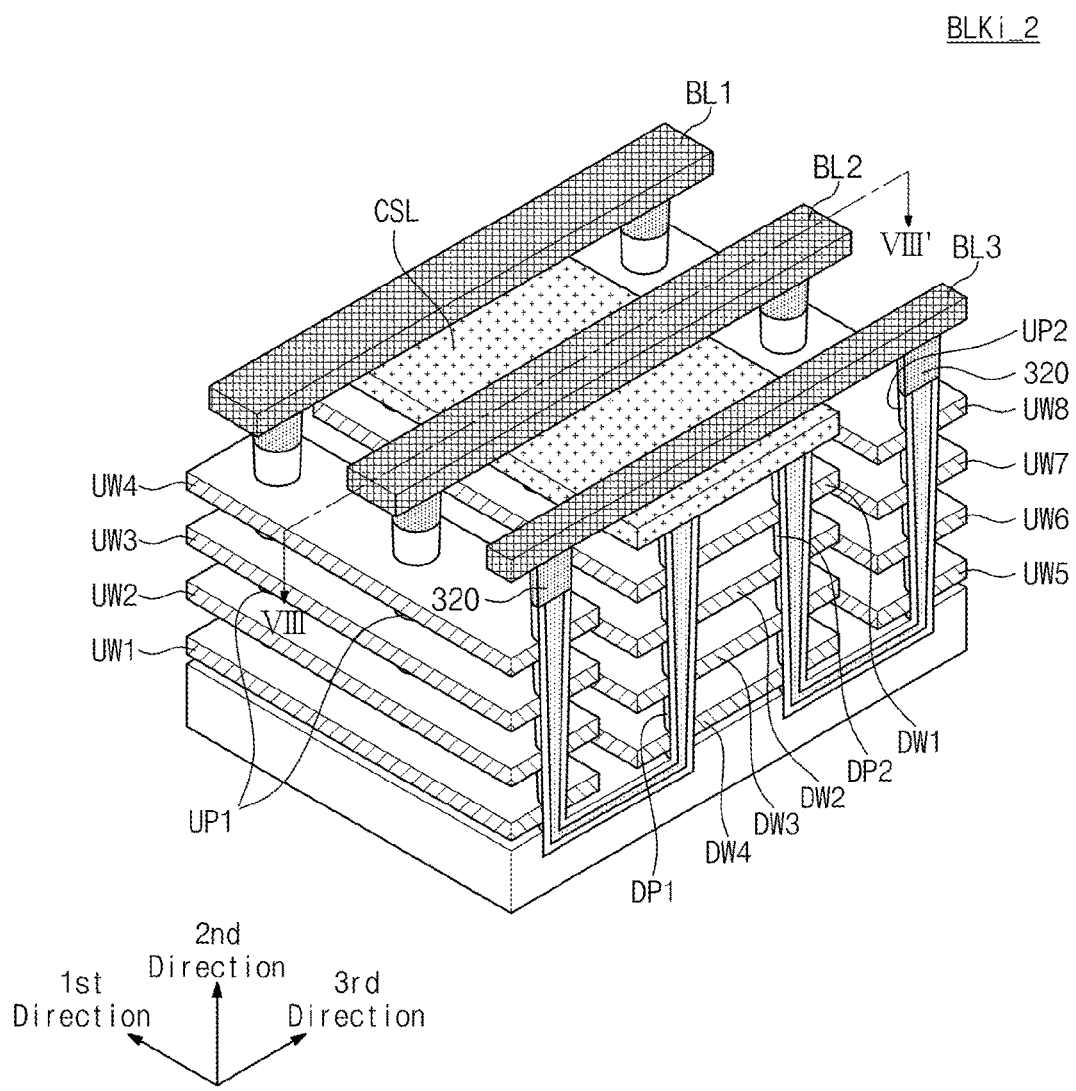
FIG. 7 is a perspective view illustrating a memory block BLKi_2 of a structure corresponding to the memory block BLKi of FIG. 3 according to example embodiments.
Figure 8:
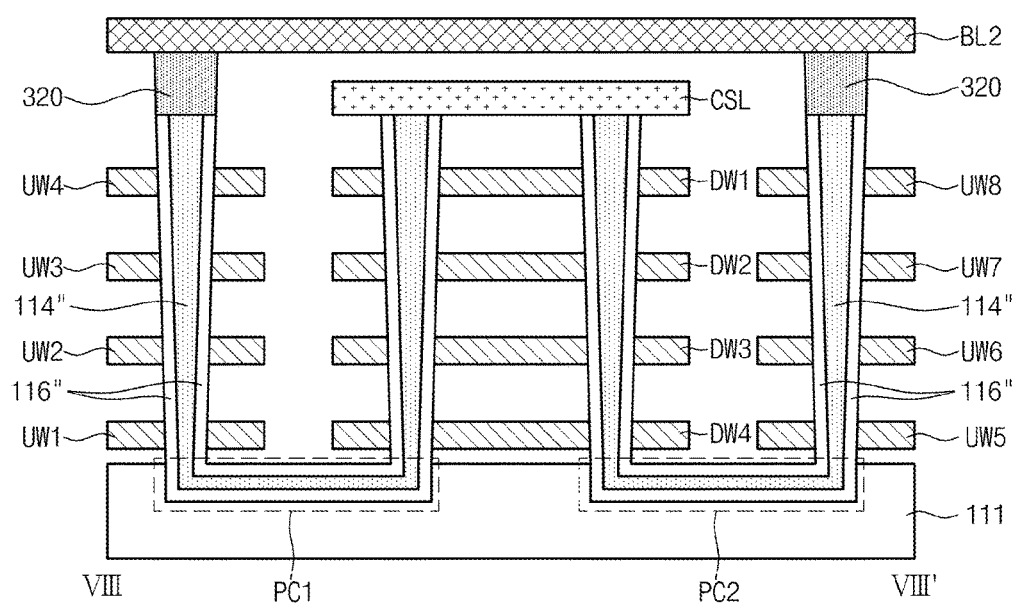
FIG. 8 is a cross sectional view taken along the line VIII-VIII' of the memory block BLKi_2 of FIG. 7.

FIG. 7 is a perspective view illustrating a memory block BLKi_2 of a structure corresponding to the memory block BLKi of FIG. 3 according to example embodiments. FIG. 8 is a cross sectional view taken along the line VIII-VIII' of the memory block BLKi_2 of FIG. 7.

Referring to FIGS. 7 and 8, first through fourth upper word lines UW1~UW4 extending in a first direction are sequentially provided on a substrate 111 along a second direction. The first through fourth upper word lines UW1~UW4 are provided to be spaced a desired (and/or alternatively predetermined) distance apart from one another along the second direction. First upper pillars UP1 are provided which are sequentially disposed along the first direction and penetrate the first through fourth upper word lines UW1~UW4 along the second direction.

First through fourth lower word lines DW1~DW4 extending in the first direction are sequentially disposed on the substrate 111 along the second direction. The first through fourth lower word lines DW1~DW4 are provided to be spaced a desired (and/or alternatively predetermined) distance from one another along the second direction. First lower pillars DP1 are provided which are sequentially disposed along the first direction and penetrate the first through fourth lower word lines DW1~DW4 along the second direction. Second lower pillars DP2 are provided which are sequentially disposed along the first direction and penetrate the first through fourth lower word lines DW1~DW4 along the second direction. The first and second lower pillars DP1 and DP2 may be disposed in parallel along the second direction.

Fifth through eighth upper word lines UW5~UW8 are sequentially provided on the substrate 111 along the second direction. The fifth through eighth upper word lines UW5~UW8 are provided to be spaced a desired (and/or alternatively predetermined) distance apart from one another along the second direction. Second upper pillars UP2 are provided which are sequentially disposed along the first direction and penetrate the fifth through eighth upper word lines UW5~UW8 along the second direction.

A common source line CSL extending along the first direction is provided on top surfaces of the first and second lower pillars DP1 and DP2. The common source line CSL may be n-type silicon. When the common source line CSL is constituted by conductive material not having polarity such as metal or polysilicon, n-type sources may be further provided between the common source line CSL and the first and second lower pillars DP1 and DP2. The common source line CSL and the first and second lower pillars DP1 and DP2 can be connected to each other through contact plugs.

Drains 320 are provided on the first and second upper pillars UP1 and UP2. The drains 320 may be n-type silicon. A plurality of bit lines BL1~BL3 extending in a third direction is sequentially provided on top surfaces of the drains 320 along the first direction. The bit lines BL1~BL3 may be constituted by metal. The bit lines BL1~BL3 and the drains 320 can be connected to each other through contact plugs.

Each of the first and second upper pillars UP1 and UP2 includes a surface layer 116" and an internal layer 114". Each of the first and second lower pillars DP1 and DP2 includes a surface layer 116" and an internal layer 114". The surface layer 116" of the first and second upper pillars UP1 and UP2 and the first and second lower pillars DP1 and DP2 may include a blocking insulating layer, a charge storage layer and a tunneling insulating layer.

The tunneling insulating layer includes a thermal oxide layer. The charge storage layer 118 includes a nitride layer or a metal oxide layer (for example, aluminum oxide layer, hafnium oxide layer, etc.). The blocking insulating layer 119 may be formed in a single layer or a multilayer. The blocking insulating layer 119 may be a high dielectric layer (e.g., aluminum oxide layer, hafnium oxide layer, etc.) having a dielectric constant higher than the tunneling insulating layer and the charge storage layer. The tunneling insulating layer, the charge storage layer and the blocking insulating layer can constitute an oxide-nitride-oxide (ONO).

The internal layer 114" of the first and second upper pillars UP1 and UP2 and the first and second lower pillars DP1 and DP2 may be p-type silicon. The internal layer 114" of the first and second upper pillars UP1 and UP2 and the first and second lower pillars DP1 and DP2 operates as a body.

The first upper pillars UP1 and the first lower pillars DP1 are connected to one another through first pipeline contacts PC1. For example, the surface layers 116" of the first upper pillars UP1 and the first lower pillars DP1 are connected to one another through surface layers of the first pipeline contacts PC1. The surface layers of the first pipeline contacts PC1 may be constituted by the same material as the surface layers 116" of the first upper pillars UP1 and the first lower pillars DP1.

The internal layers 114" of the first upper pillars UP1 and the first lower pillars DP1 are connected to one another through internal layers of the first pipeline contacts PC1. The internal layers of the first pipeline contacts PC1 may be constituted by the same material as the internal layers 114" of the first upper pillars UP1 and the first lower pillars DP1.

That is, the first upper pillars UP1 and the first through fourth upper word lines UW1~UW4 form first upper strings and the first lower pillars DP1 and the first through fourth lower word lines DW1~DW4 form first lower strings. The first upper and lower strings are connected to one another through the first pipeline contacts PC1. The drains 320 and the bit lines BL1~BL3 are connected to one end of the first upper strings. The common source line CSL is connected to one end of the first upper strings. The first upper and lower strings form a plurality of strings connected between the bit lines BL1~BL3 and the common source line CSL.

Similarly, the second upper pillars UP2 and the fifth through eighth upper word lines UW5~UW8 form second upper strings and the second lower pillars DP2 and the first through fourth lower word lines DW1~DW4 form second lower strings. The second upper and lower strings are connected to one another through the second pipeline contacts PC2. The drains 320 and the bit lines BL1~BL3 are connected to one end of the second upper strings. The common source line CSL is connected to one end of the second upper strings. The second upper and lower strings form a plurality of strings connected between the bit lines BL1~BL3 and the common source line CSL.

An equivalent circuit of the memory block BLKi_2 is the same as FIG. 3 except that 8 transistors are provided to one string and 2 strings are connected to each of the first through third bit lines BL1~BL3. However, the number of word lines, bit lines and strings of the memory block BLKi_2 is not limited.

To form a channel in the bodies 114" inside the first and second pipeline contacts PC1 and PC2, first and second pipeline contact gates (not shown) may be provided. For example, the first and second pipeline contact gates may be provided on surfaces of the first and second pipeline contacts PC1 and PC2.

The lower word lines DW1~DW4 are shared in adjacent lower pillars DP1 and DP2. However, when upper pillars adjacent to the upper pillars UP1 and UP2 are added, the adjacent upper pillars may be configured to share the upper word lines UW1~UW4 or UW5~UW8.

It is assumed that the fourth and eighth upper word lines UW4 and UW8 are used as a string select line SSL. It is assumed that the first lower word line DW1 is used as a ground select line GSL. It is assumed that the first through third upper word lines UW1~UW3, the fifth through seventh upper word lines UW5~UW7 and the second through fourth lower word lines DW2~DW4 are used as word lines WL.

As illustrated in FIGS. 7 and 8, a width of the pillar 113 is changed depending on a distance on a channel between the string select line SSL and the word line WL. For example, in the upper pillars UP1 and UP2, as a distance on a channel between the string select line SSL and the word line WL increases, a width of the pillar 113 is reduced. In the lower pillars DP1 and DP2, as a distance on a channel between the string select line SSL and the word line WL increases, a width of the pillar 113 increases.

To compensate a difference of a tunneling effect (or amount of threshold voltage variation) according to a change of a width of the pillar, levels of word line voltages may be controlled.

Figure 9:
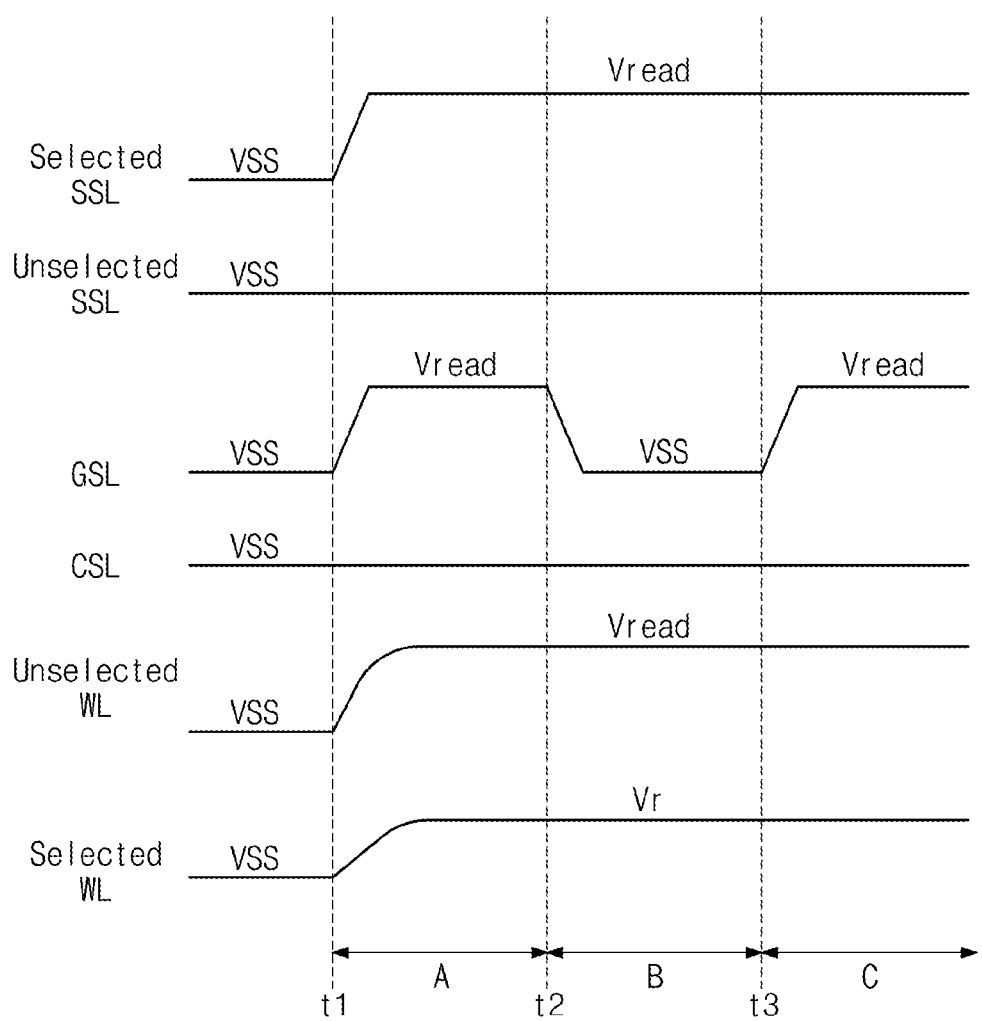
FIG. 9 is a timing diagram illustrating a method of operating a memory cell array in the memory block of FIG. 3 in a normal mode according to example embodiments.

FIG. 9 is a timing diagram illustrating a method of operating a memory cell array in the memory block of FIG. 3 in a normal mode according to example embodiments.

Referring to FIGS. 3 and 9, the same voltage may be applied to all the ground select lines GSL1~GSL4. A ground voltage VSS may be applied to the common source line CSL and unselected string select line in an entire section of a read operation.

At time t1, a read voltage Vread may be applied to a selected string select line SSL, all the ground select lines GSL and an unselected word line WL. A select read voltage Vr may be applied to the selected word line WL. For example, in the case that a string select line SSL1 is selected, the read voltage Vread may be applied to the string select line SSL1 and a ground voltage VSS may be applied to the remaining string select lines SSL2~SSL4. The read voltage Vread may be an unselect read voltage. A magnitude of the select read voltage Vr may be between a magnitude of the unselect read voltage Vread and a magnitude of the ground voltage Vss.

At time t2, the ground voltage VSS may be applied to all the ground select lines GSL. At this time, a selected bit line (not shown) may be precharged.

At time t3, the read voltage Vread may be applied to all the ground select lines GSL.

Thus, in a section A, memory cells between the unselected string select line SSL and the selected word line WL can be boosted. After that, if the selected word line is turned on in a section C, a read disturbance may occur in memory cells adjacent to the selected word line WL of the unselected string select line SSL. For example, in the case that the string select line SSL1 and the word line WL2 are selected, a read disturbance may occur in memory cells MC3 of the string select lines SSL2~SSL4. Methods for reducing (and/or preventing) that read disturbance are described in FIGS. 10 through 12.

Figure 10:
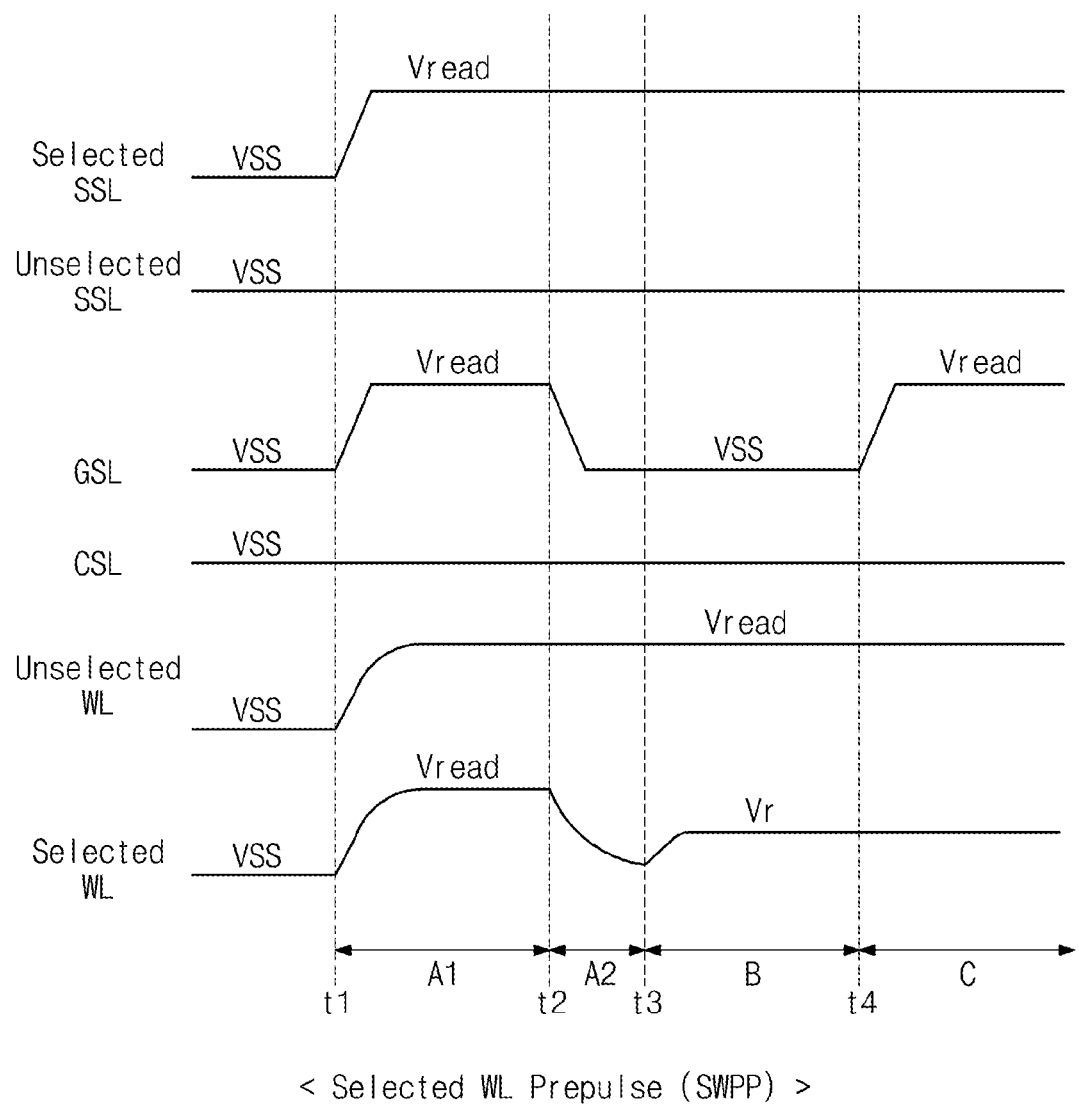
FIG. 10 is a timing diagram illustrating a method of operating a memory cell array in the memory block of FIG. 3 in a selected word line prepulse mode (SWPP) according to example embodiments.

FIG. 10 is a timing diagram illustrating a method of operating a memory cell array in the memory block of FIG. 3 in a selected word line prepulse mode according to example embodiments.

Referring to FIGS. 3 and 10, the same voltage may be applied to all the ground select lines GSL1~GSL4. In an entire section of a read operation, the ground voltage VSS may be applied to the common source line CSL and the unselected string select line SSL.

At time t1, the read voltage Vread may be applied to the selected string select line SSL, all the ground select lines GSL and the unselected word line WL. The read voltage Vread may also be applied to the selected word line WL. For example, in the case that the string select line SSL1 is selected, the read voltage Vread may be applied to the string select line SSL1 and the ground voltage VSS may be applied to the remaining string select lines SSL2~SSL4. The read voltage Vread may be applied to all the word lines WL1~WL6 during a section A1.

At time t2, the ground voltage VSS may be applied to all the ground select lines GSL and the selected word line WL.

At time t3, the select read voltage Vr may be applied to the selected word line WL. At this time, a selected bit line BL (not shown) may be precharged.

At time t4, the read voltage Vread may be applied to all the ground select lines GSL.

According to a SWPP mode, during the section A1, the read voltage Vread is applied to the selected word line WL. Thus, memory cells corresponding to the selected word line WL may all be turned on. If memory cells corresponding to the selected word line WL are all turned on, memory cells between the unselected string select line and the selected word line WL are not boosted. Thus, a read disturbance in cells adjacent to the selected word line in a section C may be limited (and/or prevented). Since a common voltage is applied to all the ground select lines GSL in a read operation, there is a disadvantage that a word line set up time and power consumption are increased.

Figure 11:
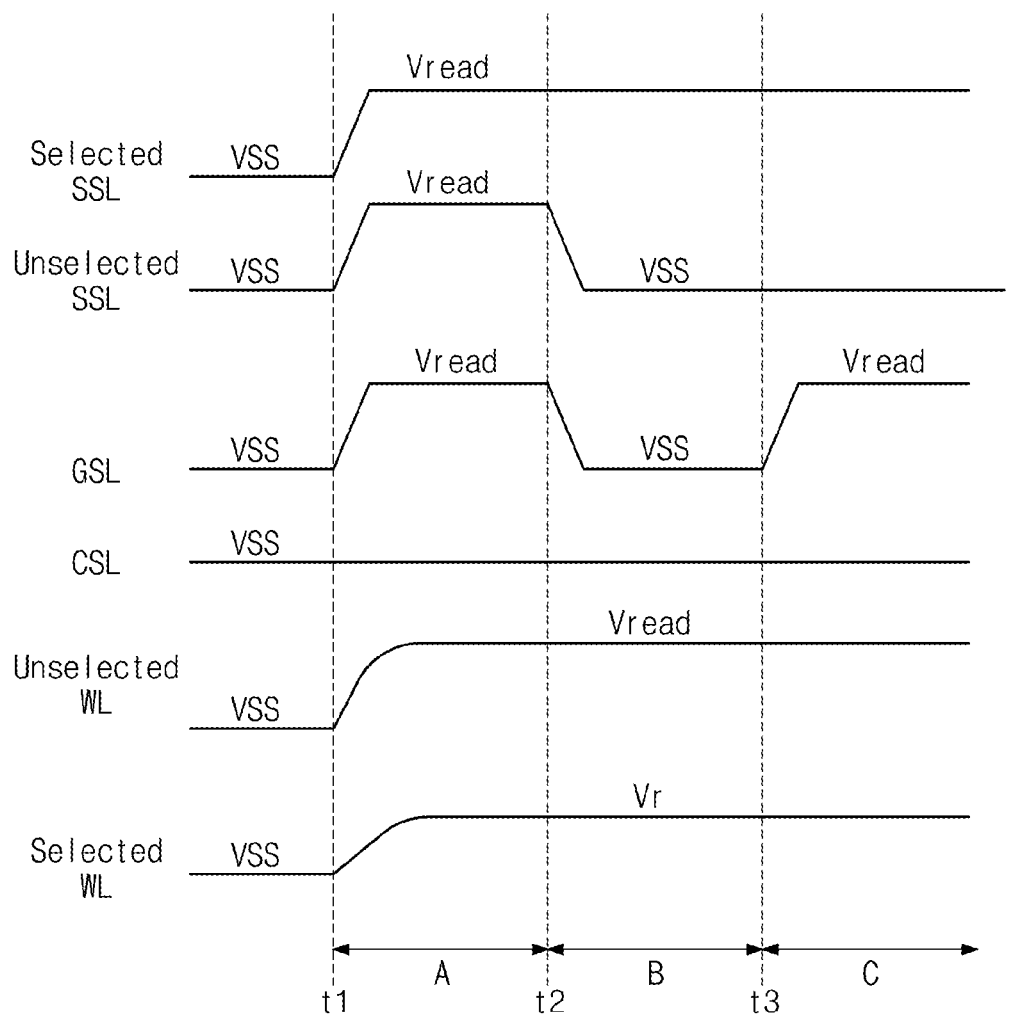
FIG. 11 is a timing diagram illustrating a method of operating a memory cell array in the memory block of FIG. 3 in an unselected string select line prepulse (USPP) mode according to example embodiments.

FIG. 11 is a timing diagram illustrating a method of operating a memory cell array in the memory block of FIG. 3 in an unselected string select line prepulse mode (USPP) according to example embodiments.

Referring to FIGS. 3 and 11, the same voltage may be applied to all the ground select lines GSL1~GSL4. In an entire section of a read operation, the ground voltage VSS may be applied to the common source line CSL.

At time t1, the read voltage Vread may be applied to the selected string select line SSL, all the ground select lines GSL and the unselected word line WL. The read voltage Vread may also be applied to the unselected word line WL. The select read voltage Vr may be applied to the selected word line WL. For example, in the case that the string select line SSL1 is selected, the read voltage Vread may be applied to all the string select lines SSL1~SSL4.

At time t2, the ground voltage VSS may be applied to all the ground select lines GSL and the unselected word line WL. At this time, a selected bit line (not shown) may be precharged.

At time t3, the read voltage Vread may be applied to all the ground select lines GSL.

According to a USPP mode, during the section A, the read voltage Vread is applied to the unselected word line WL. Thus, string select transistors corresponding to all the string select lines SSL (selected and unselected string select lines SSL) may all be turned on. If string select transistors corresponding to the unselected string select line SSL are all turned on, memory cells between the unselected string select line and the selected word line WL are not boosted. Thus, a read disturbance in cells adjacent to the selected word line in a section C may be limited (and/or prevented). However, if performing a read operation according to the USPP mode, a read operation performing time increases. Since a common voltage is applied to all the ground select lines GSL in a read operation, there is a disadvantage that a word line set up time and power consumption are increased.

Figure 12:
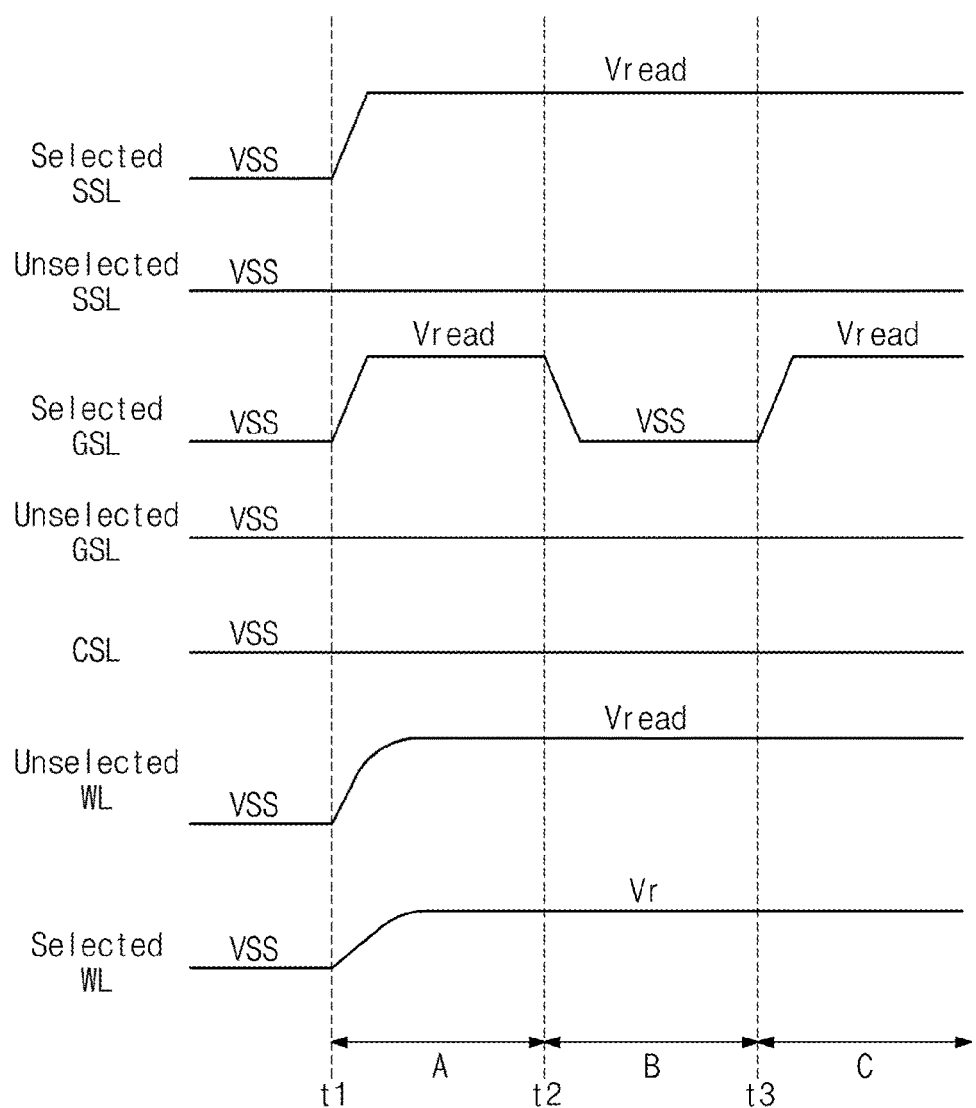
FIG. 12 is a timing diagram illustrating a method of operating a memory cell array in the memory block of FIG. 3 in a ground select line split power reduction (GSPR) mode according to example embodiments.

FIG. 12 is a timing diagram illustrating a method of operating a memory cell array in the memory block of FIG. 3 in a ground select line split power reduction (GSPR) mode according to example embodiments.

Referring to FIGS. 3 and 12, according to a GSPR mode, different voltages may be applied to the ground select lines GSL1~GSL4. That is, different voltages may be applied to the selected ground select line GSL and the unselected ground select line GSL respectively.

In an entire section of a read operation, the ground voltage VSS may be applied to the unselected string select line SSL and the unselected ground select line GSL.

At time t1, the read voltage Vread may be applied to the selected string select line SSL, the selected ground select line GSL and the unselected word line WL. The select read voltage Vr may be applied to the selected word line WL. Thus, a channel can be formed in only strings corresponding to the selected word line SSL. Memory cells corresponding to the unselected string select line SSL can all be boosted on and under the selected word line WL.

At time t2, the ground voltage VSS may be applied to the selected ground select line GSL. At this time, a selected bit line BL (not shown) may be precharged.

At time t3, the read voltage Vread may be applied to the selected ground select line GSL.

According to a GSPR mode, a channel can be formed in only strings corresponding to the selected string select line SSL. Thus, a word line set up time is shortened and power consumption can be reduced. If memory cells corresponding to the unselected string select line SSL are all boosted on and under the selected word line WL, a read disturbance in adjacent memory cells of the selected word line WL may be reduced. However, a read disturbance may still occur in a read operation according to the GSPR mode.

In FIGS. 9 through 12, the methods of applying voltages to the memory cell array are described using a read operation. However, the methods of applying voltages to the memory cell array in a read operation described in FIGS. 9 through 12 can be applied to a verification operation. Thus, the SWPP, USPP and GSPR modes can be applied to a verification operation.

Figure 13:
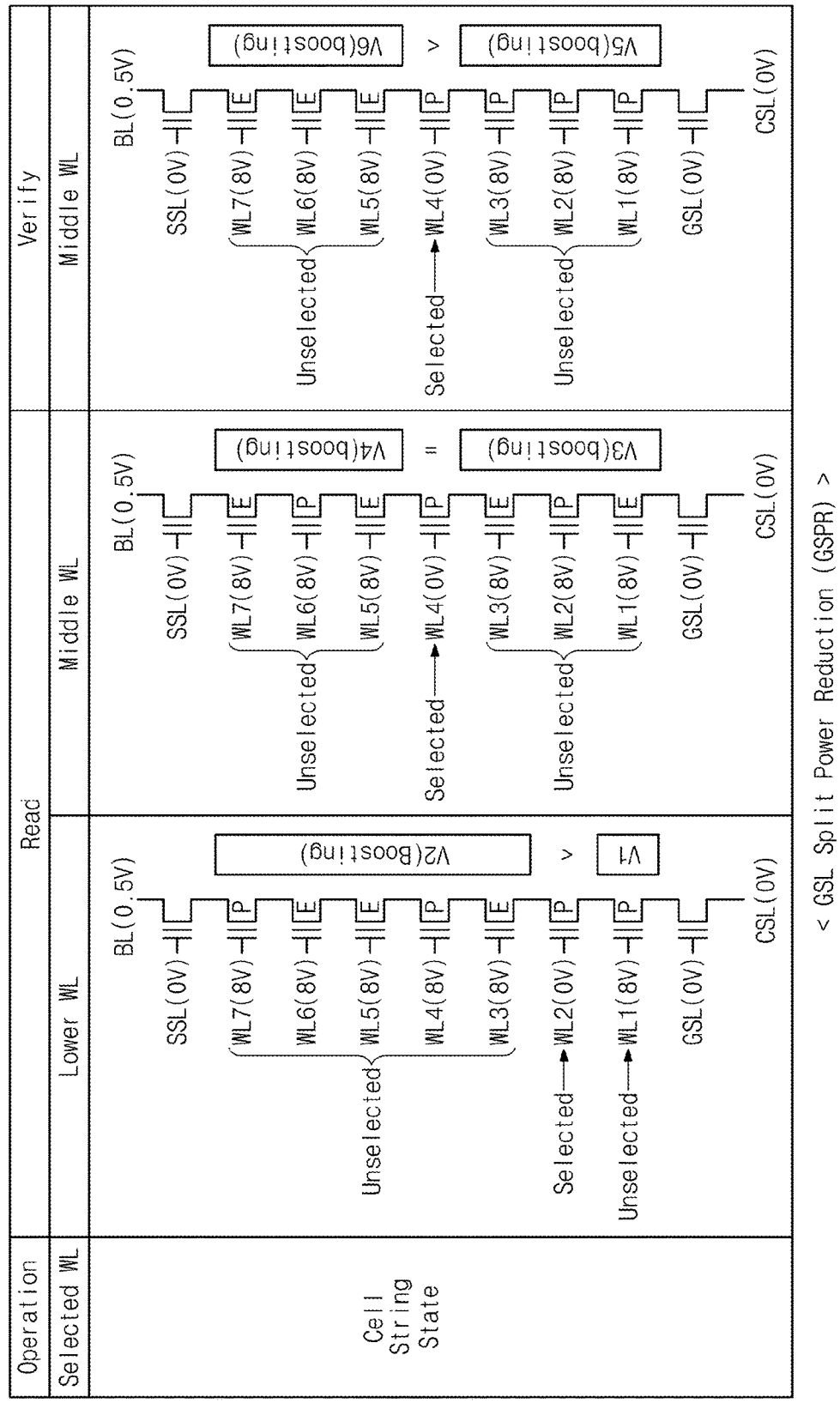
FIG. 13 is a drawing illustrating states of strings corresponding to a unselected string select line in a read operation in accordance a GSPR mode in a memory cell array of FIG. 3 according to example embodiments.

FIG. 13 is a drawing illustrating states of strings corresponding to a unselected string select line in a read operation in accordance a GSPR mode in a memory cell array of FIG. 3 according to example embodiments.

Referring to FIG. 13, according to the GSPR mode, the ground voltage VSS (0V) may be applied to the unselected string select line SSL and the unselected ground select line GSL. An upper word line WL means a word line WL adjacent to the string select line SSL. A lower word line WL means a word line adjacent to the ground select line GSL. A middle word line WL means a word line disposed between the upper word line WL and the lower word line WL.

In the case that the lower word line is selected in a read operation, memory cells located below the selected word line WL can be boosted to a first voltage V1 and memory cells located above the selected word line WL can be boosted to a second voltage V2. Since the number of memory cells located above the selected word line WL is greater than the number of memory cells located below the selected word line WL, the second voltage V2 is greater than the first voltage V1. Thus, it is more effective to use the SWPP or USPP mode rather than the GSPR mode.

In the case that the middle word line is selected in a read operation, memory cells located below the selected word line WL can be boosted to a third voltage V3 and memory cells located above the selected word line WL can be boosted to a fourth voltage V4. In a read operation, the number of memory cells programmed on the selected word line WL may be similar to the number of memory cells programmed under the selected word line WL. Thus, the third voltage V3 may be similar to the fourth voltage V4. In this case, a read disturbance may not occur.

In the case that the middle word line WL is selected in a verification operation, memory cells located below the selected word line WL can be boosted to a fifth voltage V5 and memory cells located above the selected word line WL can be boosted to a sixth voltage V6. However, unlike the read operation, in a verification operation, states of memory cells located on and under the selected word line WL are different from one another. Memory cells located below the selected word line WL have a programmed state. Memory cells located above the selected word line WL have an erase state. Thus, the sixth voltage V6 is greater than the fifth voltage V5. In this case, even if a verification operation is performed according to the GSPR mode, a read disturbance may occur.

Figures 14, 15:
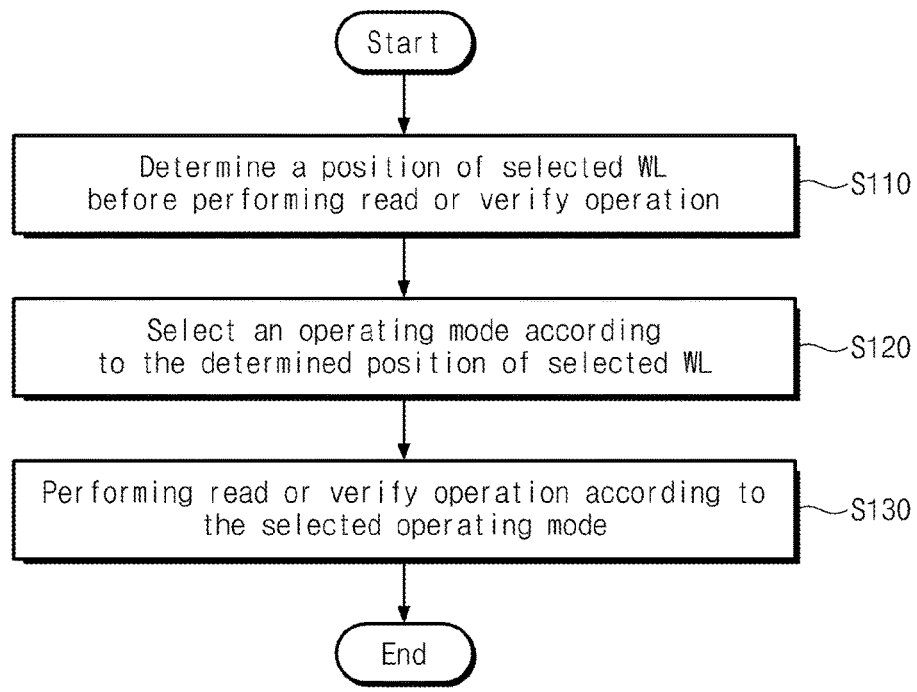
FIG. 14 is a table illustrating a method of operating a nonvolatile memory device in accordance with example embodiments.
FIG. 15 is a flow chart illustrating a method of operating a nonvolatile memory device in accordance with example embodiments.

FIG. 14 is a table illustrating a method of operating a nonvolatile memory device in accordance with example embodiments.

Referring to FIGS. 9 through 14, the nonvolatile memory device 100 in accordance with embodiments of the inventive concept can selectively use at least one of the SWPP, USPP and GSPR modes. The nonvolatile memory device 100 can perform a read or verification operation in a normal mode without using the SWPP, USPP or GSPR mode.

In the case that in a read operation, the selected word line is the upper word line WL, the nonvolatile memory device 100 can perform a read operation in a normal mode. For example, in the case that the selected word line WL is a first word line WL1 or a second word line WL2, the nonvolatile memory device 100 may not use all the SWPP, USPP and GSPR modes.

In the case that in a read operation, the selected word line is the middle word line WL, the nonvolatile memory device 100 can perform a read operation in the GSPR mode. For example, the selected word line WL is one of third through fifth word lines WL3~WL5.

In the case that in a read operation, the selected word line is the lower word line WL, the nonvolatile memory device 100 can perform a read operation in one of the SWPP and USPP modes. For example, the selected word line WL is a sixth word line WL6 or a seventh word line WL7.

In the case that in a verification operation, the selected word line is the upper word line WL or the lower word line WL, the nonvolatile memory device 100 can perform a read operation in a normal mode. As described in FIG. 13, in the case that in a verification operation, the selected word line is the middle word line, boosting voltages on the selected word line WL are different from boosting voltages under the selected word line WL. Thus, in the case that in a verification operation, the selected word line is the middle word line, the nonvolatile memory device 100 may not use the GSPR mode unlike the read operation.

In the case that in a verification operation, the selected word line is the lower word line WL, the nonvolatile memory device 100 can perform a verification operation in at least one of the SWPP and USPP modes.

In a read or verification operation, the nonvolatile memory device 100 can perform a read or verification operation selectively using a read disturbance reducing (and/or preventing) mode according to a location of the selected word line WL. Thus, the nonvolatile memory device 100 can perform a read or verification operation to have improved reliability and an improved operation speed by making a voltage waveform being applied to the memory cell array different according to a location of the selected word line WL. However, the selection relation of the SWPP, USPP and GSPR modes illustrated in FIG. 14 is only an illustration and the inventive concept is not limited to this example.

FIG. 15 is a flow chart illustrating a method of operating a nonvolatile memory device in accordance with example embodiments. Referring to FIG. 15, the nonvolatile memory device 100 can perform a read or verification operation by selecting at least one of the normal, the SWPP, the USPP and the GSPR modes according to a read disturbance reducing (and/or preventing) method.

In a step S110, the nonvolatile memory device 100 can determine a location of the selected word line WL before performing a read or verification operation. The nonvolatile memory device 100 receives an address ADDR to perform a read or verification operation. The address decoder 120 is configured to decode a row address among the received addresses ADDR. Using the decoded row address, the address decoder 120 selects string select lines SSL, word lines WL and ground select lines GSL. Thus, the nonvolatile memory device 100 can determine a location of the selected word line WL according to the received address ADDR. The selected word line WL may be one of an upper word line, a middle word line and a lower word line.

In a step S120, the nonvolatile memory device 100 can select an operation mode (e.g., normal, SWPP, USPP, GSPR) according to the determined location of the selected word line WL. The nonvolatile memory device 100 can select at least one of the normal, the SWPP, the USPP and the GSPR modes. For example, nonvolatile memory device 100 can select a read disturbance reducing (and/or preventing) mode like the table of FIG. 14. However, example embodiments are not limited thereto.

In a step S130, the nonvolatile memory device 100 can perform a read or verification operation according to the selected operation mode. For example, the nonvolatile memory device 100 can perform a read or verification operation to have improved reliability and an improved operation speed by making a voltage waveform being applied to the memory cell array different according to a location of the selected word line WL.

FIG. 16 is a flow chart illustrating a method of operating a nonvolatile memory device in accordance with example embodiments. Referring to FIG. 16, the nonvolatile memory device 100 can perform a read or verification operation by selecting at least operation mode (e.g., normal, SWPP, USPP, GSPR) according to a location of the selected word line WL.

In the case that the selected word line WL is a lower word line, the nonvolatile memory device 100 can perform a read or verification operation by selecting at least one of the SWPP and USPP modes. For example, in the case that a first word line WL1 or a second word line WL2 is selected, the nonvolatile memory device 100 can perform a read or verification operation by selecting at least one of the SWPP and USPP modes.

In the case that the selected word line WL is a middle word line, the nonvolatile memory device 100 can perform a read or verification operation by selecting the GSPR mode. For example, in the case that any one of third through n−2th word lines WL3~WLn−2 is selected, the nonvolatile memory device 100 can perform a read or verification operation by selecting the GSPR mode.

In the case that the selected word line WL is an upper word line, the nonvolatile memory device 100 can perform a read or verification operation in a normal mode without selecting one of the read disturbance reducing (and/or preventing) modes (e.g., SWPP, USPP, GSPR). For example, in the case that n−1th or nth word line WLn−1 and WLn is selected, the nonvolatile memory device 100 can perform a read or verification operation in a normal mode.

Thus, the nonvolatile memory device 100 can perform a read or verification operation to have improved reliability and an improved operation speed by making the read disturbance reducing (and/or preventing) modes (SWPP, USPP, GSPR) different according to a location of the selected word line WL. That is, the nonvolatile memory device 100 can differently set waveforms of voltages being applied to the memory cell array 110 according to a location of the selected word line WL.

The upper word line WL means a word line WL adjacent to the string select line SSL. The lower word line WL means a word line adjacent to the ground select line GSL. The middle word line WL means a word line disposed between the upper word line WL and the lower word line WL. Word lines that belong to the upper, lower and middle word lines can be set in advance. The method of selecting the read disturbance reducing (and/or preventing) modes (SWPP, USPP, GSPR) is not limited those described above and may be variously changed.

FIG. 17 is a flow chart illustrating a method of operating a nonvolatile memory device in accordance with example embodiments. Referring to FIG. 17, word lines WL1~WLn can be tied up by a specific unit to form sub blocks BLK. The nonvolatile memory device 100 can perform a read or verification operation by selecting at least one of the read disturbance reducing (and/or preventing) modes (SWPP, USPP, GSPR) by a sub block unit. For example, a first sub block Sub BLK1 may include first through third word lines WL1~WL3. A second sub block Sub BLK2 may include fourth through sixth word lines WL4~WL6. A m−1th sub block Sub BLKm−1 may include n−5th through n−3th word lines WLn−5~WLn−3. A mth sub block Sub BLKm may include n−2th through nth word lines WLn−2~WLn.

In the case that one of word lines included in the first sub block Sub BLK1 is selected, the nonvolatile memory device 100 can perform a read or verification operation in at least one of the SWPP and USPP modes. In the case that one of word lines included in the second sub block Sub BLK2 is selected, the nonvolatile memory device 100 can perform a read or verification operation in the GSPR mode. In the case that one of word lines included in the m−1th sub block Sub BLKm−1 is selected, the nonvolatile memory device 100 can perform a read or verification operation in at least one of the GSPR mode. In the case that one of word lines included in the mth sub block Sub BLKm is selected, the nonvolatile memory device 100 can perform a read or verification operation in a normal mode without selecting the read disturbance reducing (and/or preventing) modes (SWPP, USPP, GSPR).

An operation method of a nonvolatile memory device according to example embodiments is not limited to the examples described above and may be variously changed.

Figure 18:
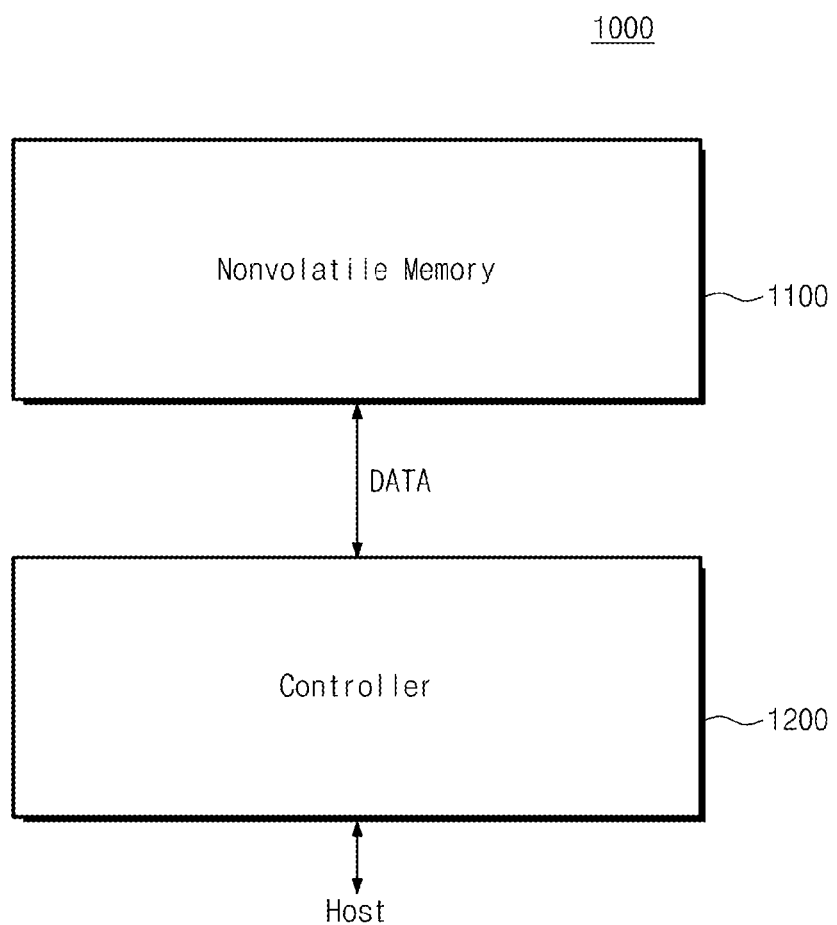
FIG. 18 is a block diagram illustrating a memory system in according with example embodiments.

FIG. 18 is a block diagram illustrating a memory system in accordance with example embodiments. Referring to FIG. 18, a memory system 1000 includes a nonvolatile memory device 1100 and a controller 1200.

The nonvolatile memory device 1100 may be the nonvolatile memory device 100 described with reference to FIGS. 1 through 17. As described with reference to FIGS. 1 through 17, the nonvolatile memory device 1100 can perform a read or verification operation by making a voltage waveform being applied to the memory cell array different according to a location of the selected word line WL. The nonvolatile memory device 1100 may include at least one of various nonvolatile memory devices such as an electrically erasable and programmable ROM (EPROM), a flash memory, a phase-change random access memory (PRAM), a resistive random access memory (RRAM), a ferroelectric random access memory (FRAM), etc.

The controller 1200 is connected to the nonvolatile memory device 1100. The controller 1200 is configured to access the nonvolatile memory device 1100. The controller 1200 is configured to control read, write, erase and background operations of the nonvolatile memory device 1100. The controller 1200 is configured to provide an interface between the nonvolatile memory device 1100 and a host.

The controller 1200 is configured to drive firmware for controlling the nonvolatile memory device 1100.

The controller 1200 may include constituent elements such as a RAM, a processing unit, a host interface, a memory interface and an error correction unit. However, example embodiments are not limited thereto.

The controller 1200 can communicate with an external device (e.g., host) according to a communication standard. For example, the controller 1200 is configured to communicate with an external device through at least one of various communication standards such as USB (universal serial bus), a MMC (multimedia card), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics) and FIREWIRE (the IEEE 1394 interface standard, which is a serial bus interface standard for communications and data transfer, corresponding to the trademark registered to Apple).

The controller 1200 and the nonvolatile memory device 1100 can be integrated in one semiconductor device. For example, the controller 1200 and the nonvolatile memory device 1100 can be integrated in one semiconductor device to form constitute a solid state drive (SSD). The controller 1200 and the nonvolatile memory device 1100 can be integrated in one semiconductor device to constitute a memory card. For example, the controller 1200 and the nonvolatile memory device 1100 can be integrated in one semiconductor device to constitute a memory card such as a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

The controller 1200 and the nonvolatile memory device 1100 can be integrated in one semiconductor device to form constitute a solid state drive (SSD). The solid state drive (SSD) includes a storage device configured to store data in a semiconductor memory. In the case that the memory system 1000 is used as the solid state drive (SSD), an operation speed of the host connected to the memory system 1000 is greatly improved.

The memory system 1000 can constitute a computer, an ultra-mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

The nonvolatile memory device 1100 or the memory system 1000 can be packaged using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi-chip package (MCP), wafer-level fabricated package (WFP) and wafer-level processed stack package (WSP).

Figure 19:
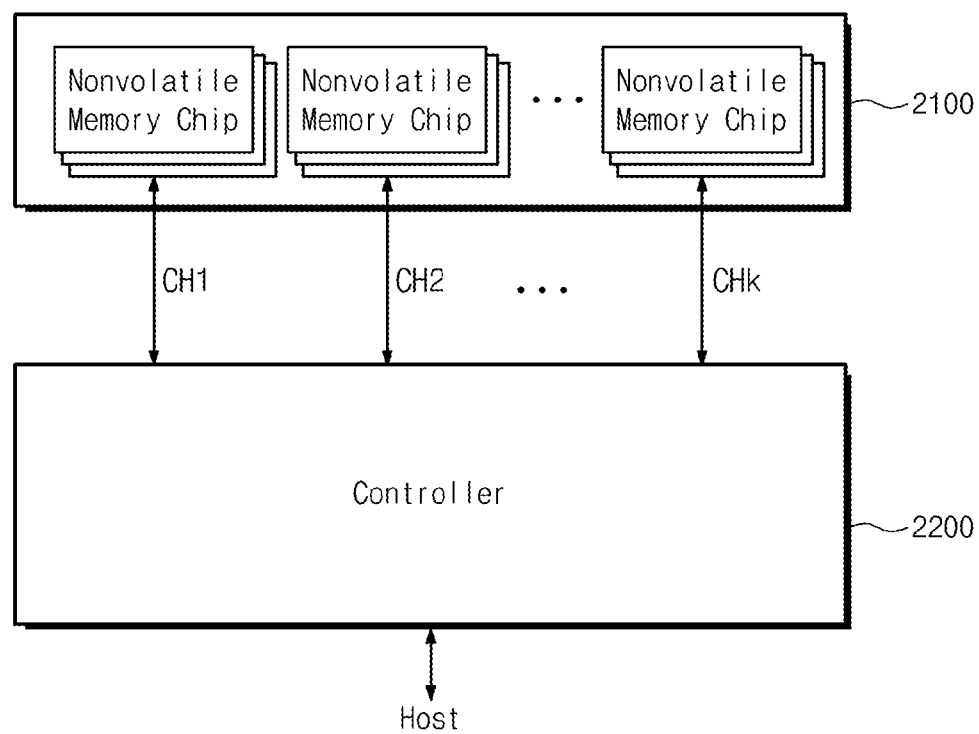
FIG. 19 is a block diagram illustrating a memory system in according with example embodiments.

FIG. 19 is a block diagram illustrating a memory system in accordance with example embodiments. Referring to FIG. 19, a memory system 2000 includes a nonvolatile memory device 2100 and a controller 2200. The nonvolatile memory device 2100 includes a plurality of nonvolatile memory chips. The nonvolatile memory chips are divided into a plurality of groups. Each group is configured to communicate with the controller 2200 through one common channel. The nonvolatile memory chips are illustrated to communicate with the controller 2200 through first through kth channels CH1~CHk.

Each nonvolatile memory chip may be the nonvolatile memory device 100 described with reference to FIGS. 1 through 17. As described with reference to FIGS. 1 through 17, each nonvolatile memory chip can perform a read or verification operation by making a voltage waveform being applied to the memory cell array different according to a location of the selected word line WL.

In FIG. 19, a plurality of nonvolatile memory chips is connected to one channel. However, the memory system 2000 may be changed so that one nonvolatile memory chip is connected to one channel.

Figure 20:
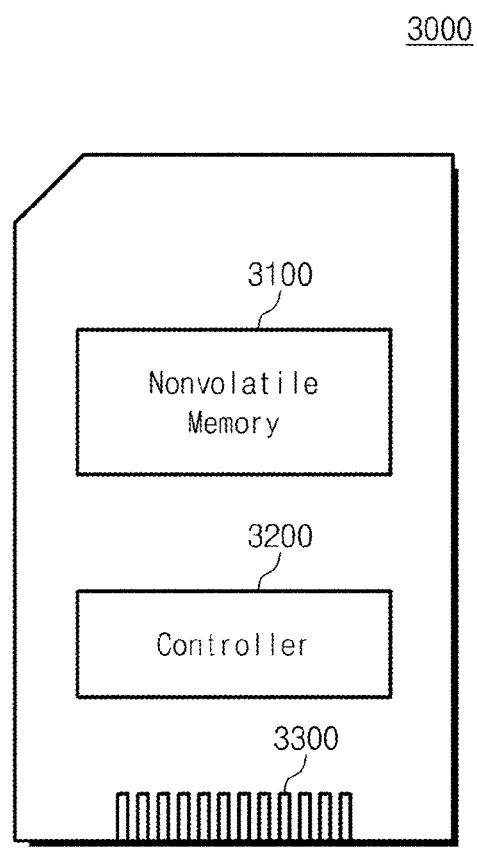
FIG. 20 is a block diagram illustrating a memory card in according with example embodiments.

FIG. 20 is a block diagram illustrating a memory card in accordance with example embodiments. Referring to FIG. 20, a memory card 3000 includes a nonvolatile memory device 3100, a controller 3200 and a connector 3300.

The nonvolatile memory device 3100 may be the nonvolatile memory device 100 described with reference to FIGS. 1 through 17. As described with reference to FIGS. 1 through 17, the nonvolatile memory device 3100 can perform a read or verification operation by making a voltage waveform being applied to the memory cell array different according to a location of the selected word line WL. The connector 3300 can electrically connect the memory card 3000 to an external device (e.g., a host).

The memory card 3000 can be constituted by memory cards such as a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

Figure 21:
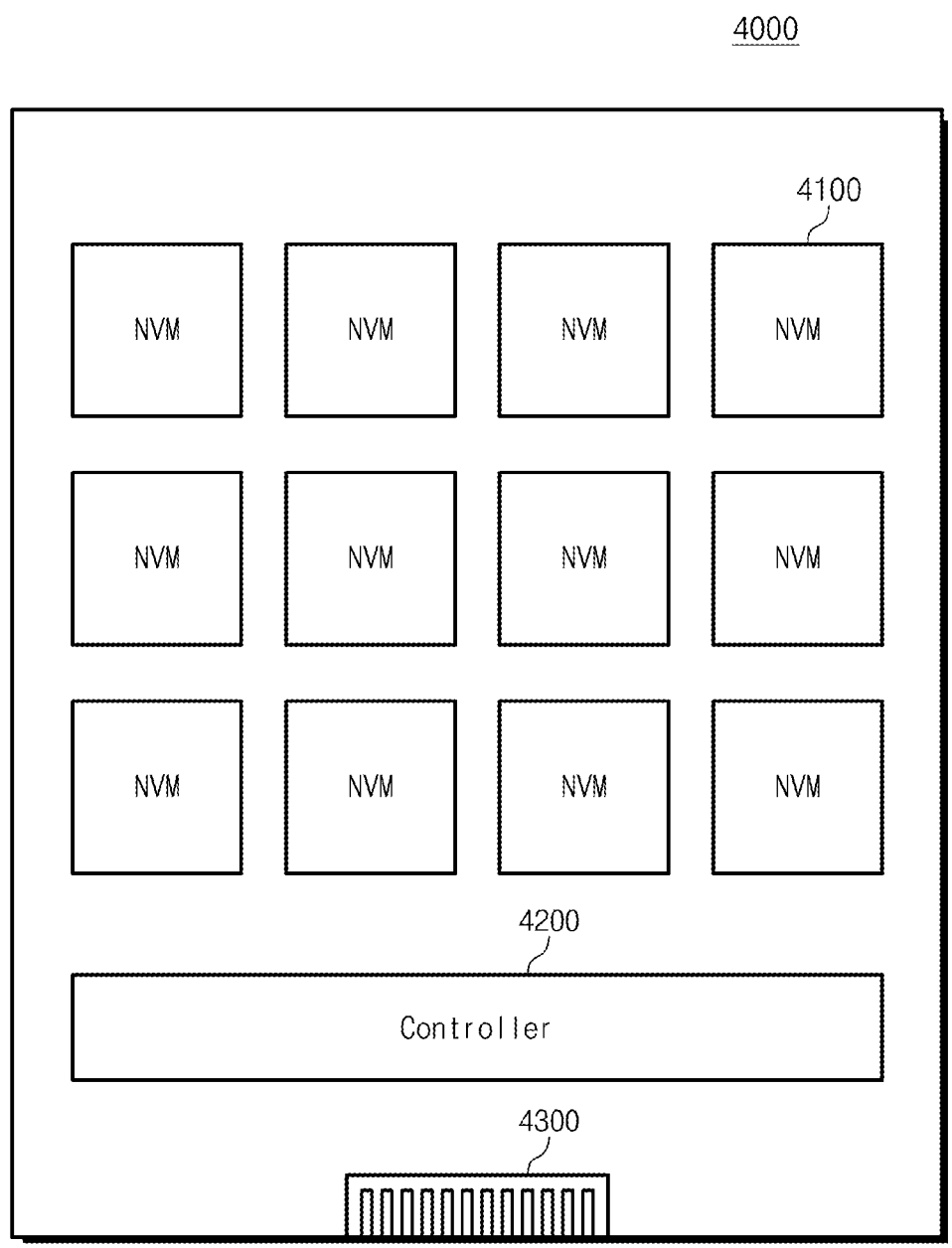
FIG. 21 is a block diagram illustrating a solid state drive in according with example embodiments.

FIG. 21 is a block diagram illustrating a solid state drive in accordance with example embodiments. Referring to FIG. 21, a solid state drive 4000 includes a plurality of nonvolatile memory devices 4100, a controller 4200 and a connector 4300.

The nonvolatile memory device 4100 may be the nonvolatile memory device 100 described with reference to FIGS. 1 through 17. As described with reference to FIGS. 1 through 17, the nonvolatile memory device 4100 can perform a read or verification operation by making a voltage waveform being applied to the memory cell array different according to a location of the selected word line WL. The connector 4300 can electrically connect the solid state drive 4000 to an external device (e.g., a host).

Figure 22:
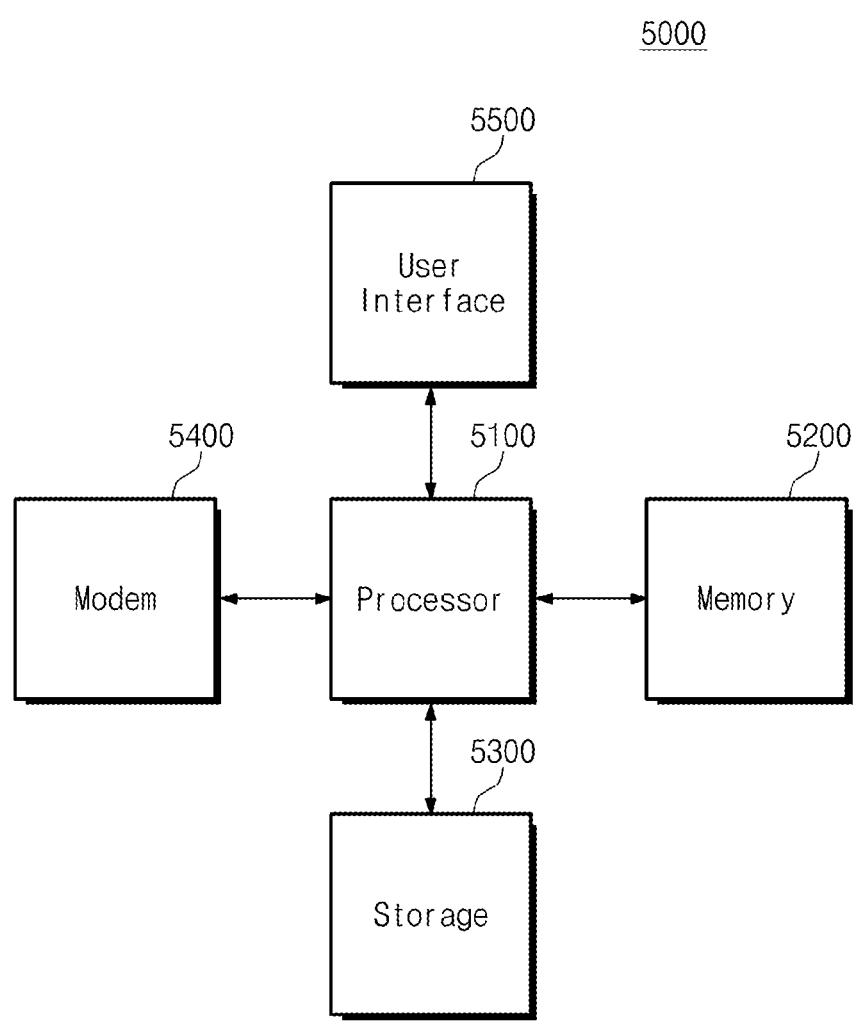
FIG. 22 is a block diagram illustrating a computing device in according with example embodiments.

FIG. 22 is a block diagram illustrating a computing device in accordance with example embodiments. Referring to FIG.

22, a computing device 5000 includes a processor 5100, a memory 5200, a storage 5300, a modem 5400 and a user interface 5500.

The processor 5100 can control the overall operation of the computing device 5000 and perform a logical operation. For example, the processor 5100 can be constituted by a system on chip SoC. The processor 5100 may be a general purpose processor or an application processor.

The memory 5200 can communicate with the processor 5100. The memory 5200 may be an operation memory (or a main memory) of the processor 5100 or the computing device 5000. The memory 5200 may include a volatile memory such as a static RAM (SRAM), a dynamic RAM (DRAM), a synchronous DRAM (SDRAM), etc. or a nonvolatile memory device such as a flash memory, a phase-change RAM (PRAM), a magnetic RAM (MRAM), a resistive RAM (RRAM), a ferroelectric RAM (FRAM), etc.

The storage 5300 can store data which the computing device 5000 desires to store for a long time. The storage 5300 may include a hard disk drive (HDD) or a nonvolatile memory device such as a flash memory, a phase-change RAM (PRAM), a magnetic RAM (MRAM), a resistive RAM (RRAM), a ferroelectric RAM (FRAM), etc.

The storage 5300 may be the nonvolatile memory device 100 described with reference to FIGS. 1 through 17. As described with reference to FIGS. 1 through 17, the storage 5300 can perform a read or verification operation by making a voltage waveform being applied to the memory cell array different according to a location of the selected word line WL.

The memory 5200 and the storage 5300 can be constituted by the same kind of nonvolatile memory device. The memory 5200 and the storage 5300 can be constituted by one semiconductor integration circuit.

The modem 5400 can communicate with an external device under the control of the processor 5100. The modem 5400 can perform a wired or wireless communication with an external device. The modem 5400 can perform a communication on the basis of at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), etc.

The user interface 5500 can communicate with a user under the control of the processor 5100. For example, the user interface 5500 may include user input interfaces such as a keyboard, a keypad, a button, a touch panel, a touch screen, a touch pad, a touch ball, a camera, a mike, a gyroscope sensor, a vibration sensor, etc. The user interface 5500 may include user output interfaces such as a liquid crystal display (LCD), an organic light emitting diode (OLED) display, an active matrix OLED (AMOLED) display, a LED, a speaker, a motor, etc.

According to example embodiments, various read disturbance reducing (and/or preventing) modes can be selectively used according to a read condition. Accordingly, a read disturbance may be reduced (and/or prevented), and a nonvolatile memory device having improved reliability and an operation method of the nonvolatile memory device are provided. In example embodiments, nonvolatile memory device can perform a read or verification operation to have improved reliability and an improved operation speed by making a voltage waveform being applied to the memory cell array different according to a location of the selected word line WL.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A read method of a nonvolatile memory device which includes a plurality of cell strings, each of the cell strings including a plurality of memory cells connected in series, the plurality of memory cells being connected to a plurality of word lines, respectively and stacked in a direction perpendicular to a substrate, and each of the cell strings including a string select transistor connected to a string select line adjacent to a bit line and a ground select transistor connected to a ground select line adjacent to a source line, the read method comprising:

applying a first voltage to a first word line of the plurality of word lines and applying an unselected read voltage to an unselected word line during a pre-pulse section of a first read operation when the first word line is selected in the first read operation; and applying a second voltage to a second word line of the plurality of word lines and applying the unselected read voltage to an unselected word line during a pre-pulse section of a second read operation when the second word line is selected in the second read operation, wherein the first voltage is sufficiently high to turn on memory cells connected to the first word line and the second voltage is less than the first voltage.

2. The read method of claim 1, wherein a distance on a channel between a string select transistor and a memory cell connected to the first word line is different from a distance on a channel between a string select transistor and a memory cell connected to the second word line.

3. The read method of claim 2, wherein the second voltage is applied to detect data stored in a memory cell connected the second word line.

4. The read method of claim 1, wherein a distance between the substrate and a memory cell connected to the first word line is different from a distance between the substrate and a memory cell connected to the second word line.

5. The read method of claim 1, further comprising:

applying a third voltage to a first unselected select line and applying the unselected read voltage to an unselected word line during a pre-pulse section when a third word line of the plurality of word lines is selected in a third read operation; and applying a fourth voltage to a second unselected select line and applying the unselected read voltage to an unselected word line voltage during a pre-pulse section when a fourth word line of the plurality of word lines is selected in a fourth read operation.

6. The read method of claim 5, wherein a distance on a channel between a string select transistor and a memory cell connected to the third word line is different from a distance on a channel between a string select transistor and a memory cell connected to the fourth word line.

7. The read method of claim 5, wherein the third voltage is sufficiently high to turn on a select transistor connected to the first unselected select line and the fourth voltage is a ground voltage.

8. The read method of claim 7, wherein each of the first and second unselected select lines is a string select line.

9. The read method of claim 7, wherein each of the first and second unselected select lines is a ground select line.

10. The read method of claim 1, wherein each of the first and second read operations is a program verify operation.

11. A read method of a nonvolatile memory device which includes a plurality of cell strings, each of the cell strings including a plurality of memory cells connected in series, the plurality of memory cells being connected to a plurality of word lines, respectively and stacked in a direction perpendicular to a substrate, and each of the cell strings including a string select transistor connected to a string select line adjacent to a bit line and a ground select transistor connected to a ground select line adjacent to a source line, the read method comprising:
applying a first voltage to a first unselected select line and applying an unselected read voltage to an unselected word line during a pre-pulse section of one read operation when a first word line of the plurality of word lines is selected in the one read operation; and
applying a second voltage to a second unselected select line and applying the unselected read voltage to an unselected word line during a pre-pulse section of another read operation when a second word line of the plurality of word lines is selected in the another read operation,
wherein the first voltage is sufficiently high to turn on a select transistor connected to the first unselected select line and the second voltage is a ground voltage.

12. The read method of claim 11, wherein a distance on a channel between a string select transistor and a memory cell connected to the first word line is different from a distance on a channel between a string select transistor and a memory cell connected to the second word line.

13. The read method of claim 11, wherein a distance between the substrate and a memory cell connected to the first word line is different from a distance between the substrate and a memory cell connected to the second word line.

14. The read method of claim 12, wherein each of the first and second unselected select lines is a string select line.

15. The read method of claim 12, wherein each of the first and second unselected select lines is a ground select line.

16. The read method of claim 12, wherein each of the one read operation and the another read operation is a program verify operation.

17. A nonvolatile memory device, comprising:
a plurality of cell strings, each of the cell strings including a plurality of memory cells connected in series, the plurality of memory cells being connected to a plurality of word lines, respectively and stacked in a direction perpendicular to a substrate, and each of the cell strings including a string select transistor connected to a string select line adjacent to a bit line and a ground select transistor connected to a ground select line adjacent to a source line; and
a voltage generator configured to provide a first voltage to a first unselected select line in one read operation and a second voltage to a second unselected select line in another read operation,
wherein the voltage generator is configured to provide the first voltage to the first unselected select line and to apply a third voltage to an unselected word line during a pre-pulse section of the one read operation when a first word line of the plurality of word lines is selected in the one read operation,
the voltage generator is configured to provide the second voltage to the second unselected select line and to apply a fourth voltage to an unselected word line during a pre-pulse section of the another read operation when a second word line of the plurality of word lines is selected in the another read operation, and
the first voltage is sufficiently high to turn on a select transistor connected to the unselected select line and the second voltage is a ground voltage.

18. The nonvolatile memory device of claim 17, wherein a distance on a channel between a string select transistor and a memory cell connected to the first word line is different from a distance on a channel between a string select transistor and a memory cell connected to the second word line, and each of the third and fourth voltages is sufficiently high to turn on the plurality of memory cells.

19. The nonvolatile memory device of claim 17, wherein each of the unselected select lines is a string select line.

20. The nonvolatile memory device of claim 17, wherein each of the unselected select lines is a ground select line.

* * * * *